US012635161B2

(12) United States Patent
Tai et al.

(10) Patent No.: US 12,635,161 B2
(45) Date of Patent: May 19, 2026

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: An-Hung Tai, Hsinchu (TW); Chia-Wei Chen, Hsinchu (TW); Shih-Hang Chiu, Taichung City (TW); Yu-Hong Lu, Hsinchu City (TW); Hui-Chi Chen, Zhudong Township (TW); Kuo-Feng Yu, Zhudong Township (TW); Jian-Hao Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 783 days.

(21) Appl. No.: 17/726,812

(22) Filed: Apr. 22, 2022

(65) Prior Publication Data

US 2023/0343857 A1 Oct. 26, 2023

(51) Int. Cl.
*H10D 30/01* (2025.01)
*H10D 30/62* (2025.01)
(Continued)

(52) U.S. Cl.
CPC ....... *H10D 30/024* (2025.01); *H10D 30/6211* (2025.01); *H10D 84/0184* (2025.01);
(Continued)

(58) Field of Classification Search
CPC ....... H01L 29/66795; H01L 21/823821; H01L 21/823864; H01L 27/0924; H01L 29/7851; H01L 29/161; H01L 29/165; H01L 29/4966; H01L 29/7848; H01L 29/0673; H01L 29/66545; H01L 29/775; H01L 21/823481; H01L 27/088; H01L 29/42392; H01L 29/66439; H01L 29/78696; B82Y 10/00; H10D 30/014; H10D 30/024;
(Continued)

(56) References Cited

U.S. PATENT DOCUMENTS 11,398,384 B2 7/2022 Peng et al.
2017/0186743 A1* 6/2017 Chiou ................... H01L 29/785
2021/0202714 A1* 7/2021 Yu ........................ H01L 29/7848

FOREIGN PATENT DOCUMENTS

TW 202145318 A 12/2021

* cited by examiner

*Primary Examiner* — Meiya Li
(74) *Attorney, Agent, or Firm* — STUDEBAKER BRACKETT PLLC

(57) ABSTRACT

In a method of manufacturing a semiconductor device, a lower conductive layer is formed in an opening formed in a dielectric layer, and the lower conductive layer is recessed to form a space. A blanket conductive layer is formed over the recessed lower conductive layer in the space, a sidewall of the space and an upper surface of the dielectric layer. Part of the blanket conductive layer formed on the sidewall of the space and the upper surface of the dielectric layer is removed, thereby forming an upper conductive layer on the lower conductive layer, and a cap insulating layer is formed over the upper conductive layer in the space. The blanket conductive layer is formed by physical vapor deposition.

20 Claims, 28 Drawing Sheets

(51) Int. Cl.
    *H10D 84/01*        (2025.01)
    *H10D 84/03*        (2025.01)
    *H10D 84/85*        (2025.01)

(52) U.S. Cl.
    CPC ....... *H10D 84/0193* (2025.01); *H10D 84/038*
                (2025.01); *H10D 84/853* (2025.01)

(58) Field of Classification Search
    CPC .............. H10D 30/43; H10D 30/6211; H10D
              30/6735; H10D 30/6757; H10D 30/797;
              H10D 62/121; H10D 62/822; H10D
              62/832; H10D 64/017; H10D 64/667;
              H10D 84/0151; H10D 84/0184; H10D
              84/0193; H10D 84/038; H10D 84/83;
                              H10D 84/853
    See application file for complete search history.

110
106
104
102
40
14
35
12
30
10

Z

X

90

106
104
102
65

110

80

14

Z

Y

METHOD OF MANUFACTURING A SEMICONDUCTOR DEVICE AND A SEMICONDUCTOR DEVICE

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) or a gate-all-around (GAA) FET. Fin FET devices typically include semiconductor fins with high aspect ratios and in which channel and source/drain regions of semiconductor transistor devices are formed, and GAA FET devices include semiconductor nanosheets or nanowires as channel regions and a gate structure wrapping around each of the channel regions. A metal gate structure is used to produce faster, more reliable and better-controlled semiconductor transistor devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
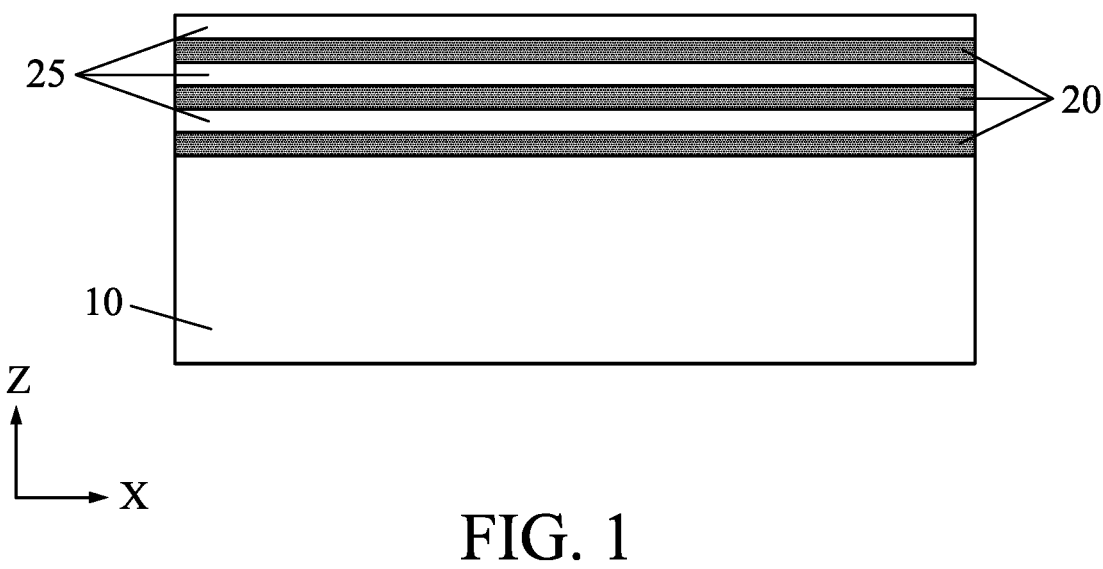
FIGS. 1, 2, 3, 4, 5, 6, 7, 8A, 8B and 9 show various stages of a sequential manufacturing operation of a semiconductor FET device according to an embodiment of the present disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. In the following embodiments, materials, configurations, dimensions, processes and/or operations as described with respect to one embodiment (e.g., one or more figures) may be employed in the other embodiments, and detailed description thereof may be omitted.

In a semiconductor manufacturing process, various metal filling processes are employed to fill a space, hole or opening formed in or by a dielectric material. In some embodiments, the metal filling process is used to form a via or a contact connecting a lower conductive layer and an upper conductive layer. In some embodiments, the metal filling process is used to form a metal gate electrode in a gate replacement technology.

In a gate replacement technology, a sacrificial gate structure including a sacrificial gate electrode (made of, for example, polysilicon) is first formed over a channel region and subsequently is replaced with a metal gate structure. In metal gate FinFETs or GAA FETs, various metal materials, such as a barrier layer, a work function adjustment layer, an adhesion layer or a body metal layer, are filled in a space from which a sacrificial gate structure is removed. In some FET devices, after the gate replacement process to form a metal gate structure, an upper portion of the metal gate structure is recessed and a cap insulating layer is formed over the recessed gate structure to secure an isolation region between the metal gate electrode and adjacent conductive contacts. Further, in advanced FET devices, various FETs (n-channel and p-channel FETs) with different threshold voltages are fabricated in one device and FETs may have different metal (e.g., work function adjustment metals) structures.

In the present disclosure, a novel gate replacement process for FET devices, which improves a bottom coverage by one or more conductive layers and improve a process window, is disclosed.

FIGS. 1-28B show views of various stages of a sequential manufacturing operation of a semiconductor device according to the present disclosure. It is understood that additional operations may be provided before, during, and after the processes shown by FIGS. 1-28B, and some of the operations described below can be replaced or eliminated for additional embodiments of the method. The order of the operations/processes may be interchangeable.

As shown in FIG. 1, first semiconductor layers 20 and second semiconductor layers 25 are alternately formed over a substrate 10. In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is, for example, a p-type silicon substrate with an impurity concentration in a range from about $1\times10^{15}$ atoms·cm$^{-3}$ to about $1\times10^{16}$ atoms·cm$^{-3}$. In other embodiments, the substrate is an n-type silicon or germanium substrate with an impurity concentration in a range from about $1\times10^{15}$ atoms·cm$^{-3}$ to about $1\times10^{16}$ atoms·cm$^{-3}$. In some embodiments, before the stacked layers are formed, impurity ions (dopants) are implanted into the silicon substrate 10 to form p-type and/or n-type well regions. The ion implantation is performed to prevent a punch-through effect. In some embodiments, the dopant concentration in the well regions is in a range from about $1\times10^{19}$ atoms·cm$^{-3}$ to about $1\times10^{21}$ atoms·cm$^{-3}$.

In some embodiments, the first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M" compound" or an "M based compound" means the majority of the compound is M.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different from the thickness of the second semiconductor layers 25. Although three first semiconductor layers 20 and three second semiconductor layers 25 are shown in FIG. 1, the numbers are not limited to three, and can be 1, 2, or more than 3, and is less than 20. In some embodiments, the number of the first semiconductor layers 20 is greater by one than the number of the second semiconductor layers 25 (the top and bottom layers are the first semiconductor layer). In some embodiments, at least the second semiconductor layers 25, which are subsequently used as channel regions, are non-doped or doped with impurities in a smaller amount than the well regions. In some embodiments, the dopant concentration in the second semiconductor layer 25 is less than about $1\times10^{17}$ atoms·cm$^{-3}$.

Figure 2:
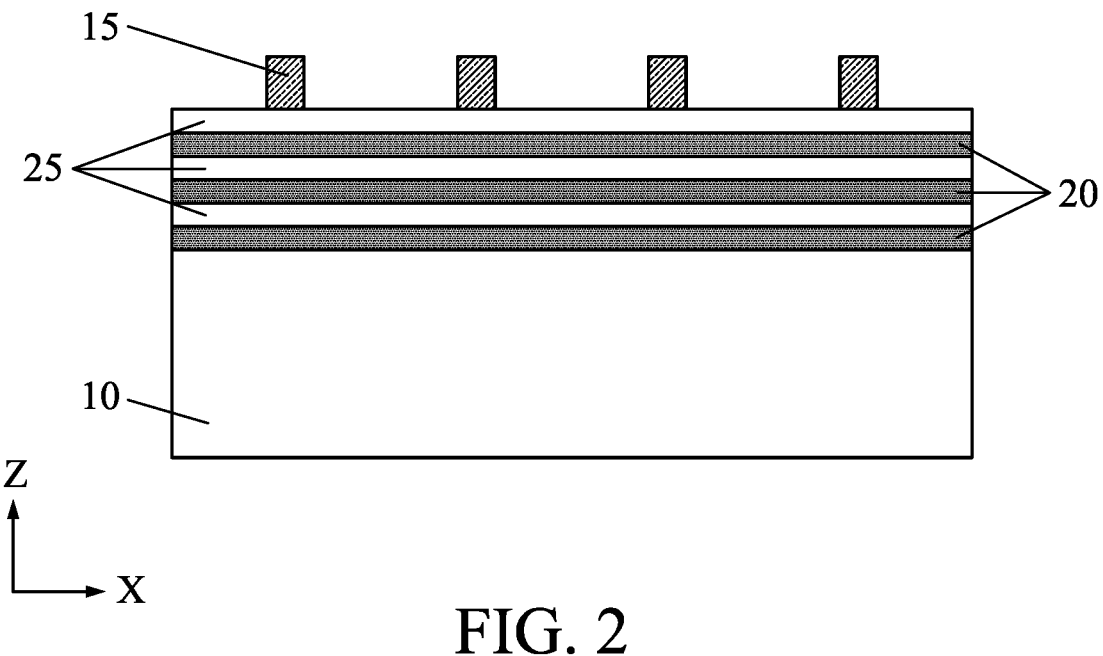

After the stacked semiconductor layers are formed, one or more layers for a hard mask pattern are formed over the stacked semiconductor layers. The hard mask layer is patterned into a hard mask pattern 15 as shown in FIG. 2. In some embodiments, the hard mask pattern 15 includes one or more layers of silicon oxide, silicon nitride, SiON and other suitable material, in some embodiments. In certain embodiments, the hard mask pattern 15 includes silicon nitride.

Figure 3:
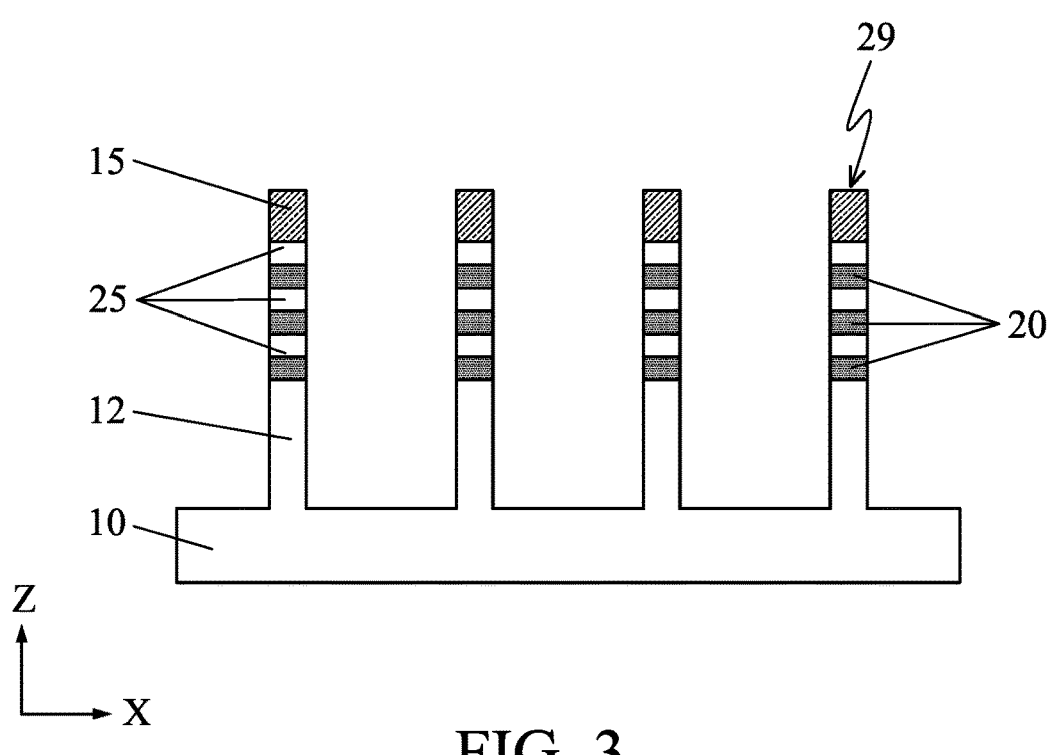

Then, the stacked semiconductor layers 20, 25 and a part of the substrate are patterned into fin structures 29, as shown in FIG. 3. The fin structures 29 may be patterned by any suitable method. For example, the fin structures 29 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as the hard mask pattern 15 to pattern the fin structures 29. In some embodiments, one or more dummy fin structures are formed on both sides of the fin structures 29 to improve pattern fidelity in the patterning operations. As shown in FIG. 3, the fin structure 29 includes an upper portion constituted by the stacked semiconductor layers 20, 25 and a bottom fin structure 12 (well region). As shown in FIG. 3, the fin structures 29 extend in the Y direction (not shown) and are arranged in the X direction. The number of the fin structures 29 is not limited to four as shown in FIG. 3, and may be as small as one and five or more.

The width of the upper portion of the fin structure 29 along the X direction is in a range from about 5 nm to about 40 nm in some embodiments, and is in a range from about 10 nm to about 20 nm in other embodiments. The height of the fin structure 29 is in a range of about 50 nm to about 300 nm in some embodiments, and is in a range of about 20 nm to 100 nm in other embodiments. The space between the fin structures 29 is in a range of about 5 nm to about 80 nm in some embodiments, and may be in a range of about 10 nm to 40 nm in other embodiments. In some embodiments, a pitch of the fin structures is in a range from about 10 nm to 120 nm, and is in a range from about 14 nm to about 35 nm in other embodiments. One skilled in the art will realize, however, that the dimensions and values recited throughout the descriptions are merely examples, and may be changed to suit different scales of integrated circuits. In some embodiments, the Fin FET device is an n-type Fin FET. In other embodiments, the Fin FET device is a p-type Fin FET. In certain embodiments, the semiconductor device is a complimentary metal-oxide-semiconductor (CMOS) device.

Figure 4:
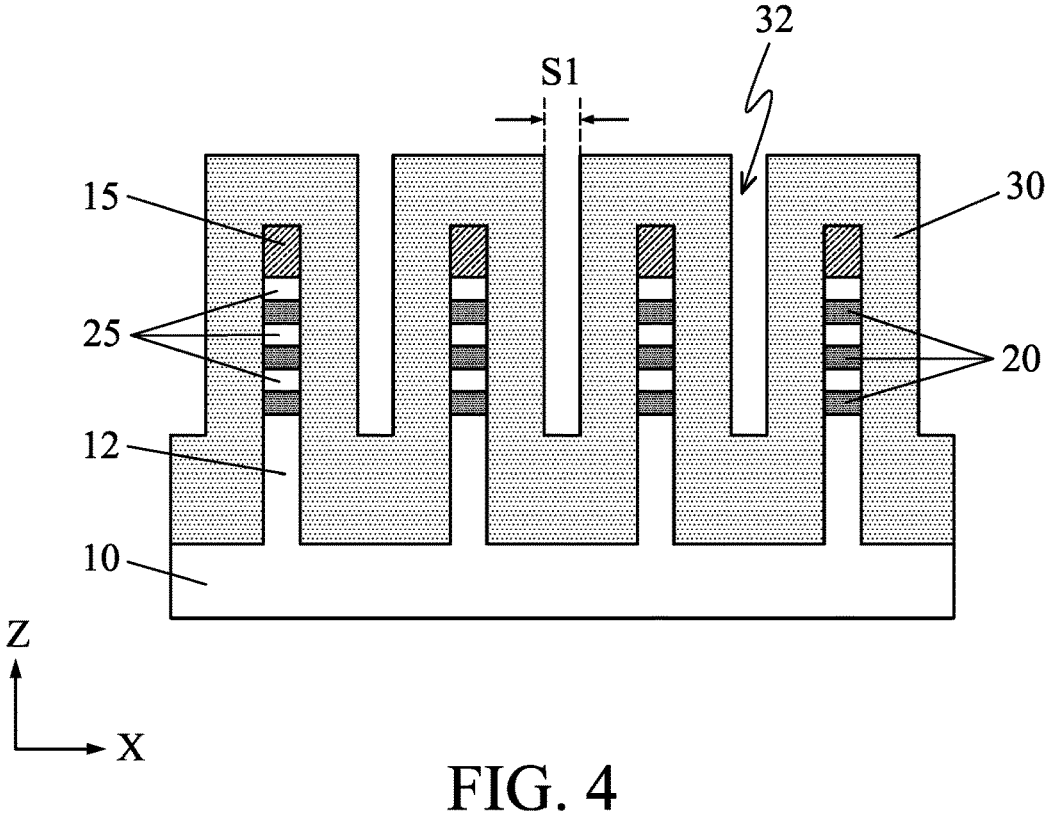

After the fin structures 29 are formed, a first dielectric layer 30 is formed over the fin structures 29 as shown in FIG. 4. The first dielectric layer 30 includes one or more layers of insulating materials such as silicon oxide, silicon oxynitride, silicon nitride, SiOC, SiCN or SiOCN, formed by LPCVD (low pressure chemical vapor deposition), plasma-CVD or atomic layer deposition (ALD), or any other suitable film formation method. In certain embodiments, silicon oxide is used as the first dielectric layer 30. In some embodiments, as shown in FIG. 4, the first dielectric layer 30 is conformally formed over the fin structures 29 such that a first space 32 is formed between adjacent fin structures 29. The thickness of the first dielectric layer 30 is adjusted so that the space S1 is in a range of about 5 nm to about 40 nm in some embodiments, and is in a range of about 7 nm to about 15 nm in certain embodiments.

Figure 5:
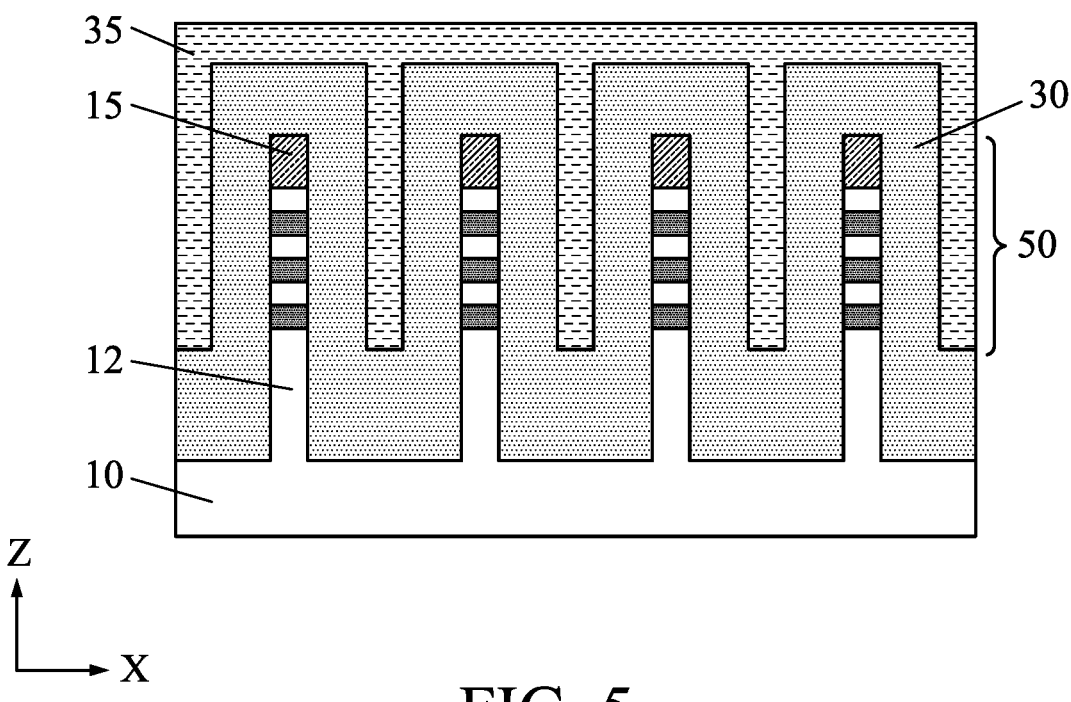

After the first dielectric layer 30 is formed, a second dielectric layer 35 is formed over the first dielectric layer 30, as shown in FIG. 5. The material of the second dielectric layer 35 is different from the material of the first dielectric layer 30. In some embodiments, the second dielectric layer 35 includes one or more layers of insulating materials such as silicon oxide, silicon oxynitride or silicon nitride, SiOC, SiCN or SiOCN formed by LPCVD, plasma-CVD or ALD, or any other suitable film formation method. In some embodiments, the second dielectric layer 35 includes a first layer 35-1 made of silicon nitride and a second layer 35-2 made of silicon oxide as shown in FIG. 8B. As shown in FIGS. 5 and 8B, the second dielectric layer 35, in particular, the second layer 35-2, fully fills the first space 32 and covers the top of the first dielectric layer 30, in some embodiments. In other embodiments, a void is formed in the bottom part of the first space 32. In some embodiments, after the second dielectric layer 35 is formed, a planarization operation, such as an etch-back process or a chemical mechanical polishing (CMP) process, is performed to planarize the upper surface of the second dielectric layer 35.

Figure 6:
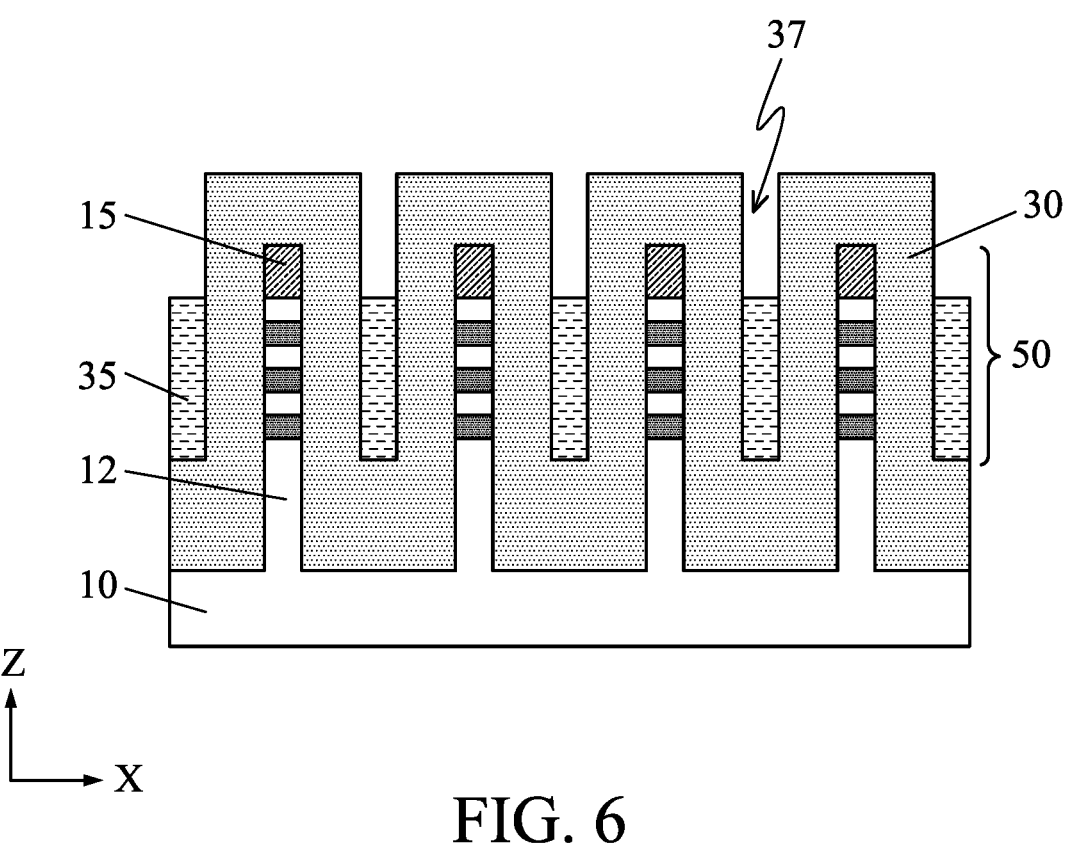

Next, the second dielectric layer 35 is recessed down below the top of the fin structures 29 by using a suitable dry and/or wet etching operation, as shown in FIG. 6. As shown in FIG. 6, a second space 37 is formed over the recessed second dielectric layer 35. In some embodiments, the upper surface of the recessed second dielectric layer 35 has a V-shape or a U-shape (see FIG. 8B).

Figure 7:
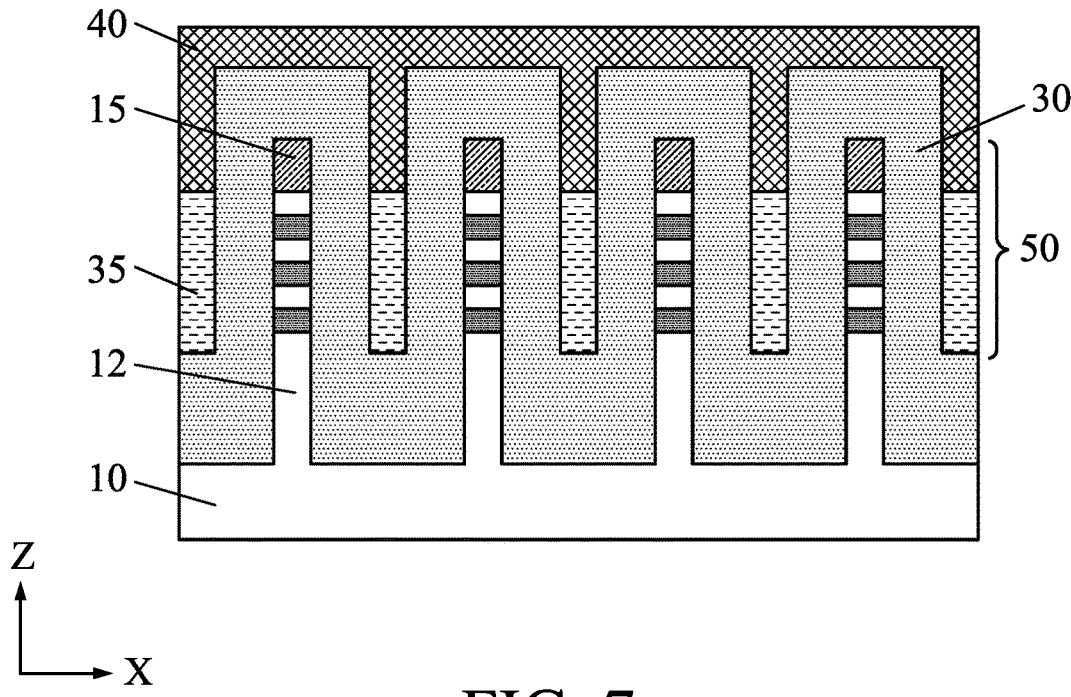

Further, after the second dielectric layer 35 is recessed, a third dielectric layer 40 is formed over the first dielectric layer 30 and the recessed second dielectric layer 35, as shown in FIG. 7. The material of the third dielectric layer 40 is different from the materials of the first dielectric layer 30 and the second dielectric layer 35 in some embodiments. In some embodiments, the third dielectric layer 40 includes one or more insulating material layers. In some embodiments, at least one of the insulating material layers has a lower etching rate than the second dielectric layer 35 against a polysilicon etching. In some embodiments, the third dielectric layer 40 includes a high-k dielectric material. In some embodiments, the third dielectric layer 40 includes a dielectric material having a higher dielectric constant (k) than the second dielectric layer 35 and/or the first dielectric layer 30. When the upper surface of the recessed second dielectric layer 35 has a V-shape or a U-shape, the bottom of the third dielectric layer 40 has a V-shape or a U-shape.

In some embodiments, the third dielectric layer 40 includes one or more of non-doped hafnium oxide (e.g., $HfO_x$, $0<x\leq2$), hafnium oxide doped with one or more other elements (e.g., HfSiO, HfSiON, HfTaO, HfTiO or HfZrO), zirconium oxide, aluminum oxide, titanium oxide, and a hafnium dioxide-alumina ($HfO_2$—$Al_2O_3$) alloy. In certain embodiments, hafnium oxide ($HfO_x$) is used as the third dielectric layer 40. The third dielectric layer can be formed by LPCVD, plasma-CVD or ALD, or any other suitable film formation method. In some embodiments, the second dielectric layer 35 is made of silicon nitride. As shown in FIG. 7, the third dielectric layer 40 fully fills the second space 37 and covers the top of the first dielectric layer 30, in some embodiments. In some embodiments, after the third dielectric layer 40 is formed, a planarization operation, such as an etch-back process or a CMP process, is performed to planarize the upper surface of the third dielectric layer 40. In some embodiments, the third dielectric layer 40 includes a first layer 40-1 made of a high-k material (e.g., hafnium oxide), a second layer 40-2 made of a silicon based insulating material (e.g., silicon oxide) and a third layer 40-3 made of a high-k material (e.g., hafnium oxide) as shown in FIG. 8B.

Figure 8A:
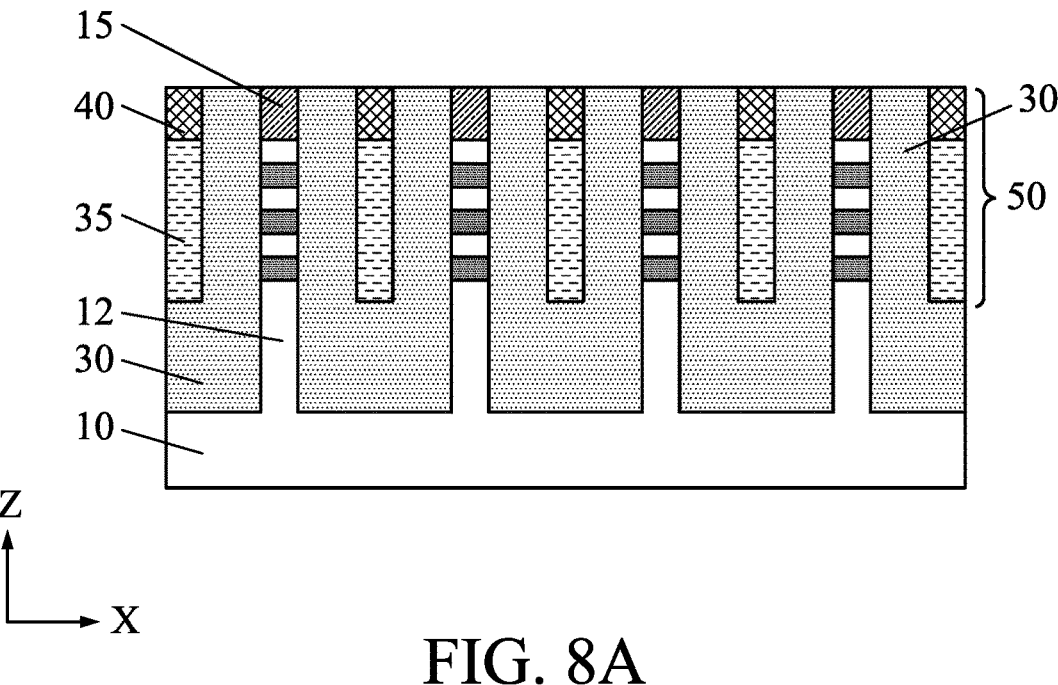
Figure 8B:
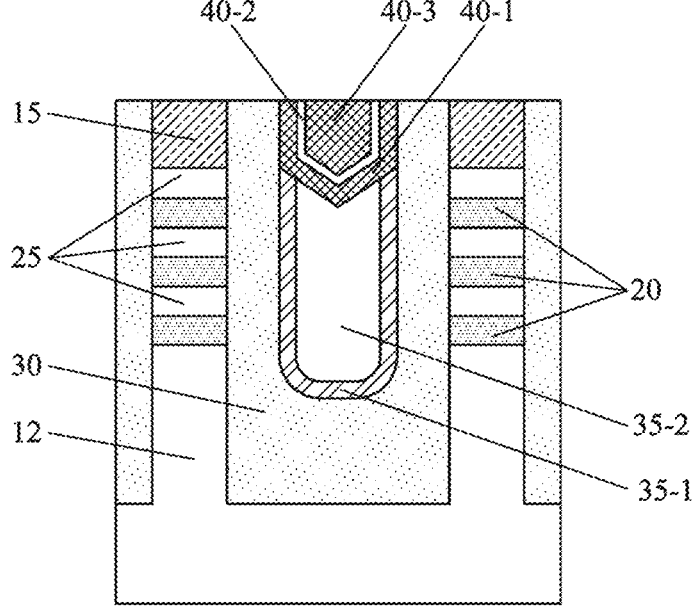
Figure 8B:
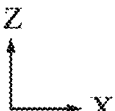

Next, the third dielectric layer 40 is planarized to the top of the fin structures 29 by using a suitable dry and/or wet etching operation to form a wall fin structure 50 (dummy dielectric fin or hybrid dielectric fin), as shown in FIGS. 8A and 8B. As shown in FIGS. 8A and 8B, the wall fin structure 50 includes the third dielectric layer 40 formed on the recessed second dielectric layer 35, as a hybrid fin structure. In some embodiments, the upper surface of the recessed third dielectric layer 40 has a V-shape or a U-shape.

Figure 9:
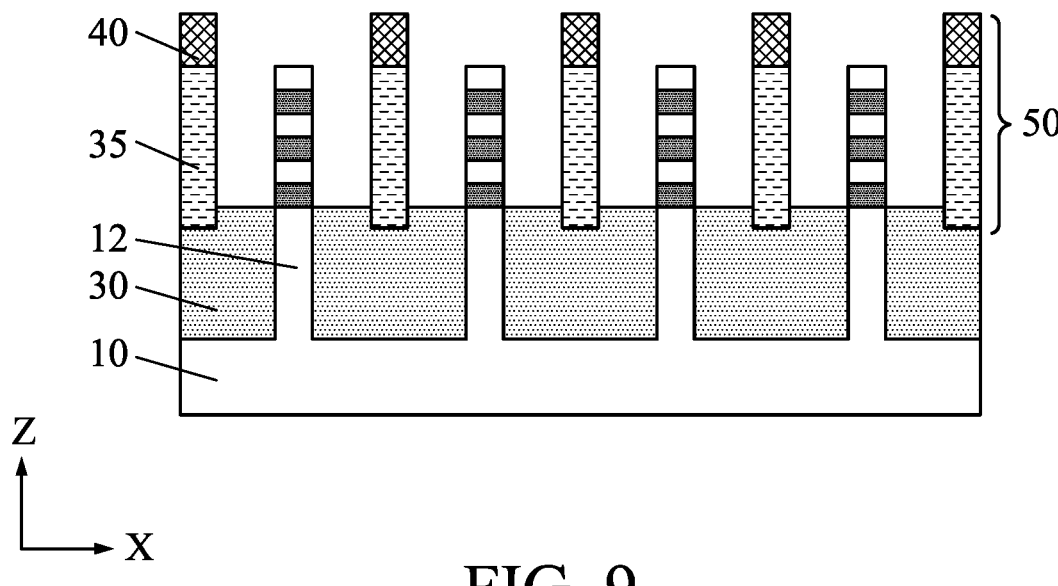

Then, the first dielectric layer 30 is recessed down below the top of the fin structures 29 by using a suitable dry and/or wet etching operation so that an upper portion of the wall fin structure 50 and the upper portion of the fin structures 39 are exposed, as shown in FIG. 9. The recessed first dielectric layer 30 functions as an isolation insulating layer (e.g., shallow trench isolation (STI)) to electrically isolate one fin structure from adjacent fin structures. In some embodiments, the hard mask pattern 15 is also removed.

Figure 10A:
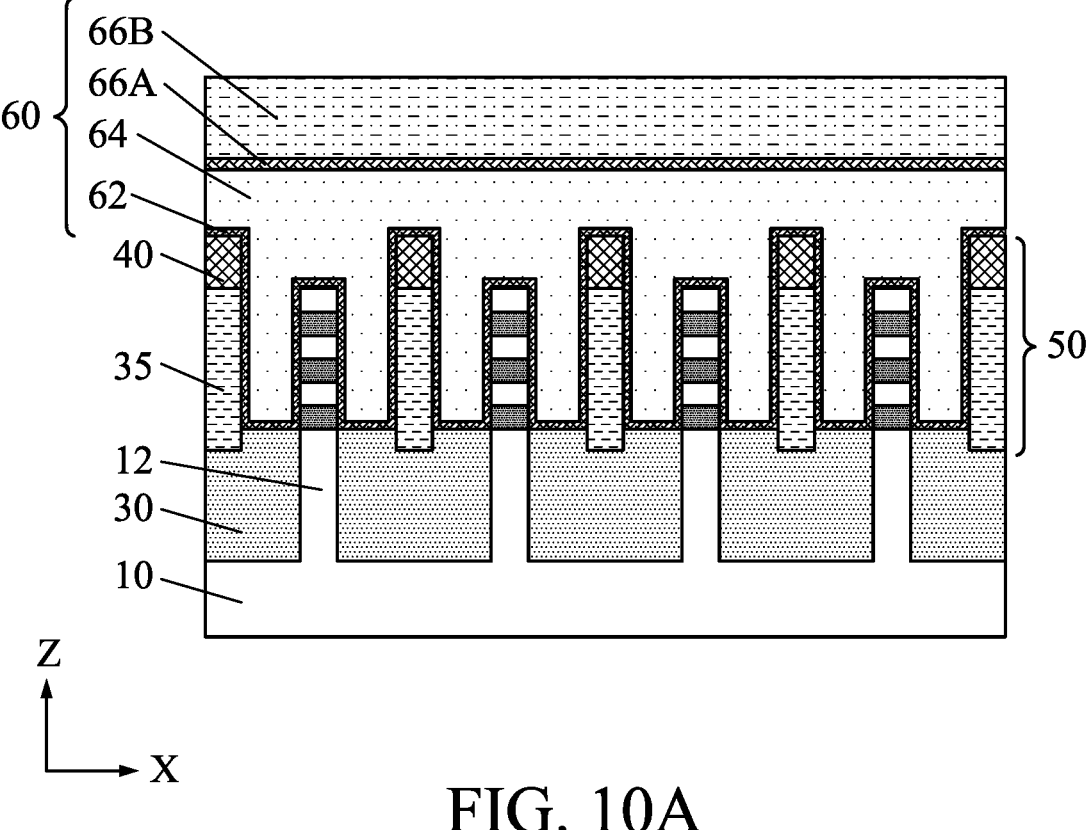
FIGS. 10A, 10B and 10C show one of the various stages of a sequential manufacturing operation of a semiconductor FET device according to an embodiment of the present disclosure.
Figure 10B:
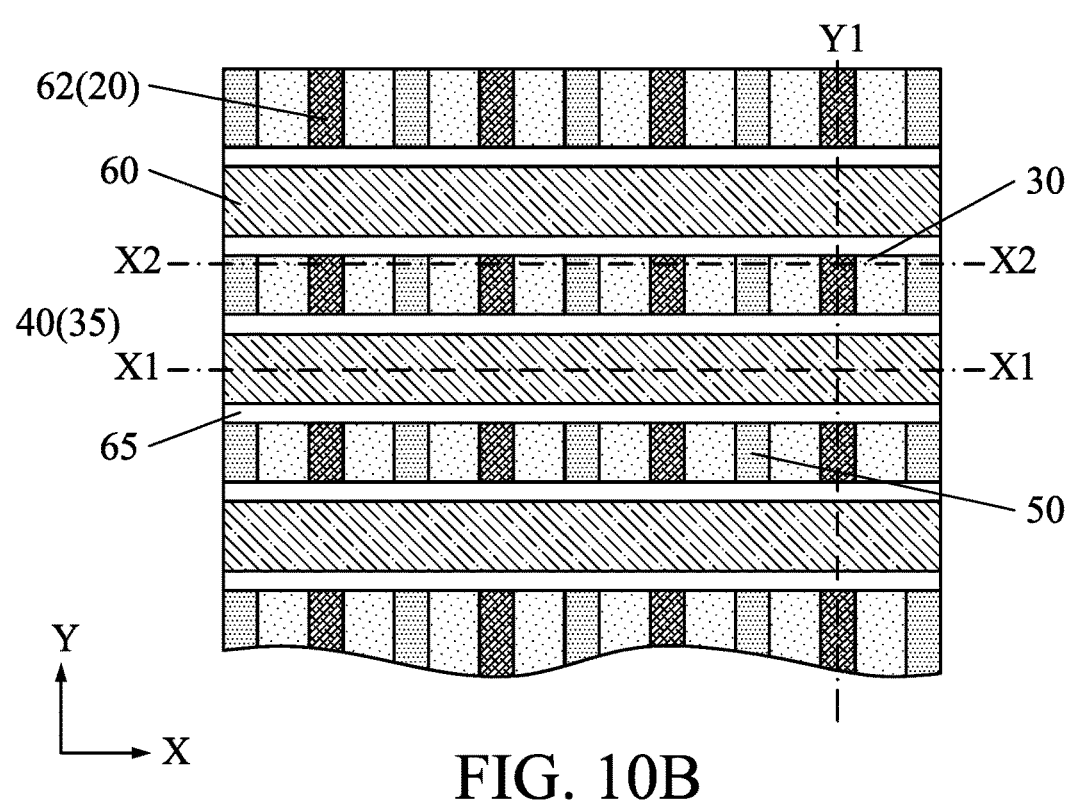
Figure 10C:
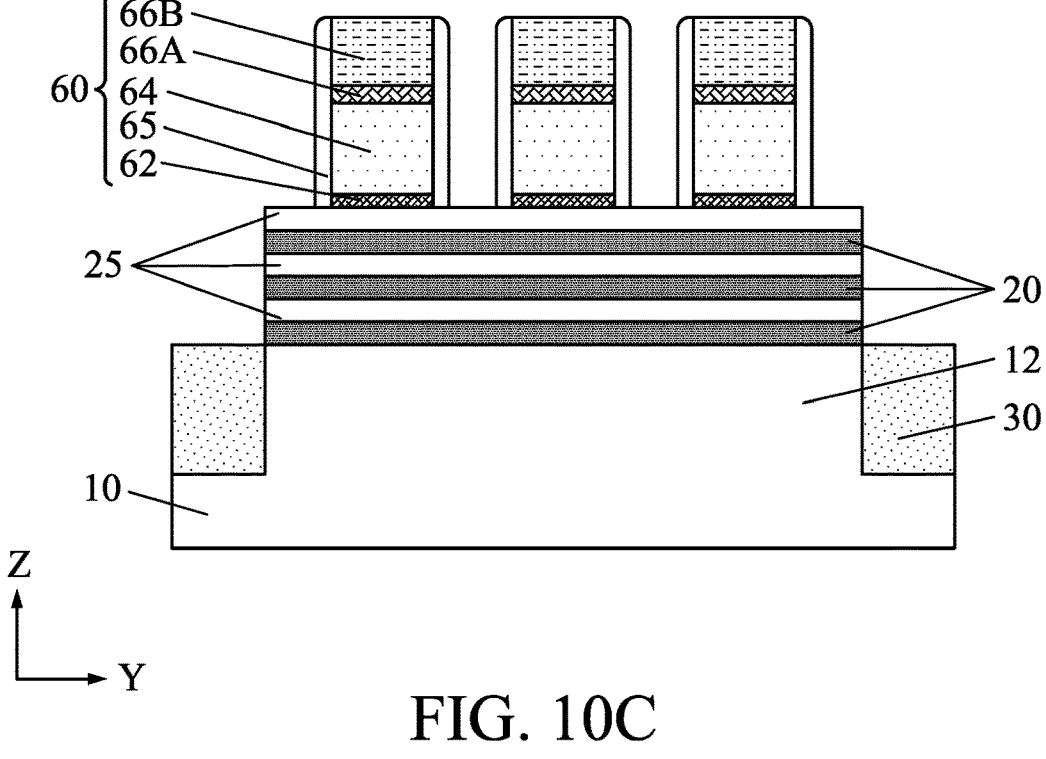

Subsequently, a sacrificial gate structure 60 is formed over channel regions of the fin structures 29 and the wall fins 50, as shown in FIGS. 10A-10C. FIG. 10B is a plan view (layout view or top view), FIG. 10A is a cross sectional view corresponding to line X1-X1 of FIG. 10B and FIG. 10C is a cross sectional view corresponding to line Y1-Y1 of FIG. 10B. The sacrificial gate structure 60 includes a sacrificial gate dielectric layer 62 and a sacrificial gate electrode layer 64. In some embodiments, the sacrificial gate structure 60 further includes a hard mask layer over the sacrificial gate electrode layer 64. In some embodiments, the hard mask layer includes a first hard mask layer 66A and a second hard mask layer 66B.

A blanket layer for the sacrificial gate dielectric layer and a blanket polysilicon layer are formed over the isolation insulating layer 30, the fin structures 29 and the wall fin structure 50, and then patterning operations are performed so as to obtain the sacrificial gate structure 60 as shown in FIGS. 10A and 10B. The patterning of the polysilicon layer is performed by using a hard mask including a silicon nitride layer as the first hard mask layer 66A and an oxide layer as the second hard mask layer 66B in some embodiments. In other embodiments, the first hard mask layer 66A is silicon oxide and the second hard mask layer 66B is silicon nitride. The sacrificial gate dielectric layer 62 is formed by oxidation in some embodiments. In other embodiments, the sacrificial gate dielectric layer 62 is formed by CVD, PVD, ALD, e-beam evaporation, or other suitable film deposition process.

As shown in FIG. 10B, three sacrificial gate structures 60 extending in the X direction are disposed adjacent to each other in the Y direction. However, the number of the sacrificial gate structures is not limited to three. The numbers may be one, two, four or five or more. In addition, one or more dummy gate structures may be disposed adjacent to both sides of the sacrificial gate structures 60 to improve pattern fidelity in patterning processes. The width of the sacrificial gate structure 60 is in a range of about 5 nm to about 40 nm in some embodiments, and is in a range of about 7 nm to about 15 nm in certain embodiments. In some embodiments, the wall fin structure 50 surrounds the fin structure 29.

Further, as shown in FIGS. 10B and 10C, gate sidewall spacers 65 are formed on side faces of the sacrificial gate structures 60. An insulating material layer for the gate sidewall spacers 65 is formed over the sacrificial gate structure 60. The insulating material layer is deposited in a conformal manner so that it is formed to have substantially equal thicknesses on vertical surfaces, such as the sidewalls, horizontal surfaces, and the top of the sacrificial gate structure 60, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, horizontal portions of the insulating material layer are removed by anisotropic etching, thereby forming the gate sidewall spacers 65. In some embodiments, the gate sidewall spacers 65 include two to four layers of different insulating materials.

Figures 11, 12:
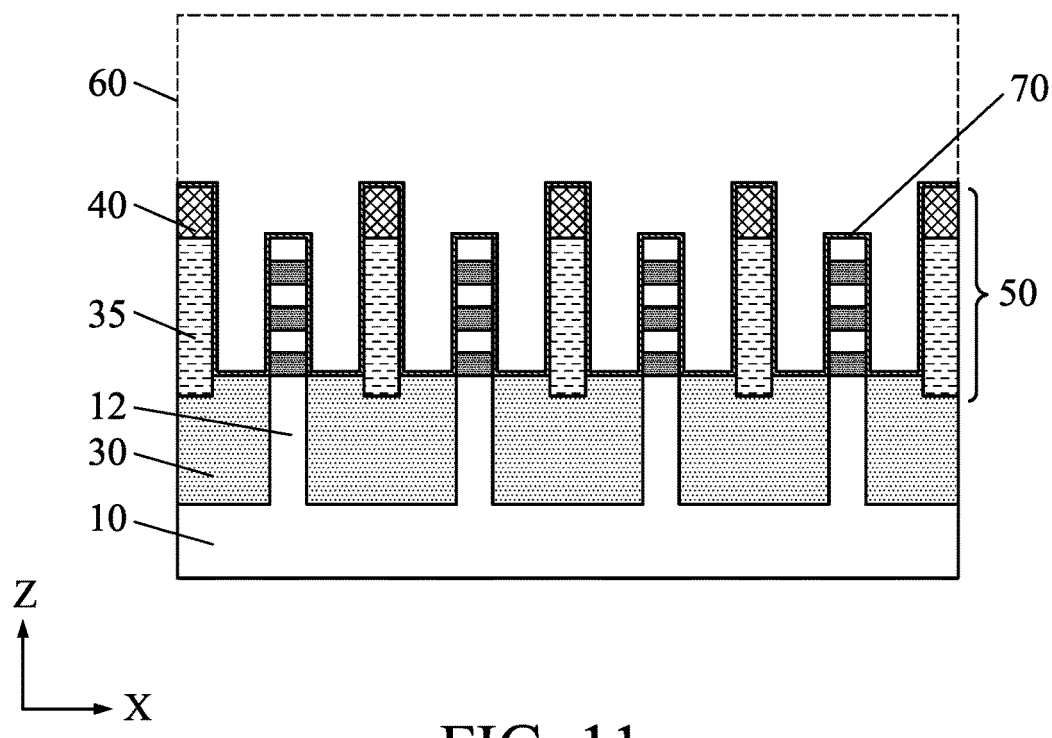
FIGS. 11 and 12 show various stages of a sequential manufacturing operation of a semiconductor FET device according to an embodiment of the present disclosure.

Subsequently, as shown in FIG. 11, a fin liner layer 70 is formed over the source/drain regions of the fin structures 29 and the wall fin structures 50. FIG. 11 is a cross sectional view corresponding to line X2-X2 of FIG. 10B (source/drain region). The fin liner layer 70 includes one or more layers of insulating materials such as silicon oxide, silicon oxynitride, silicon nitride, SiOC, SiCN or SiOCN, formed by LPCVD, plasma-CVD or atomic layer deposition (ALD), or any other suitable film formation method. In certain embodiments, silicon nitride is used as the fin liner layer 70. In some embodiments, the fin liner layer 70 has a thickness in a range from about 5 nm to about 20 nm.

Then, as shown in FIG. 12, horizontal portion of the fin liner layer 70 is removed by anisotropic etching. By this etching, the top of the source/drain region of the fin structure 29 and the top of the wall fin structure 50 are exposed and the fin liner layer 70 remains on side faces of the fin structure 29 as fin sidewalls.

Figure 13A:
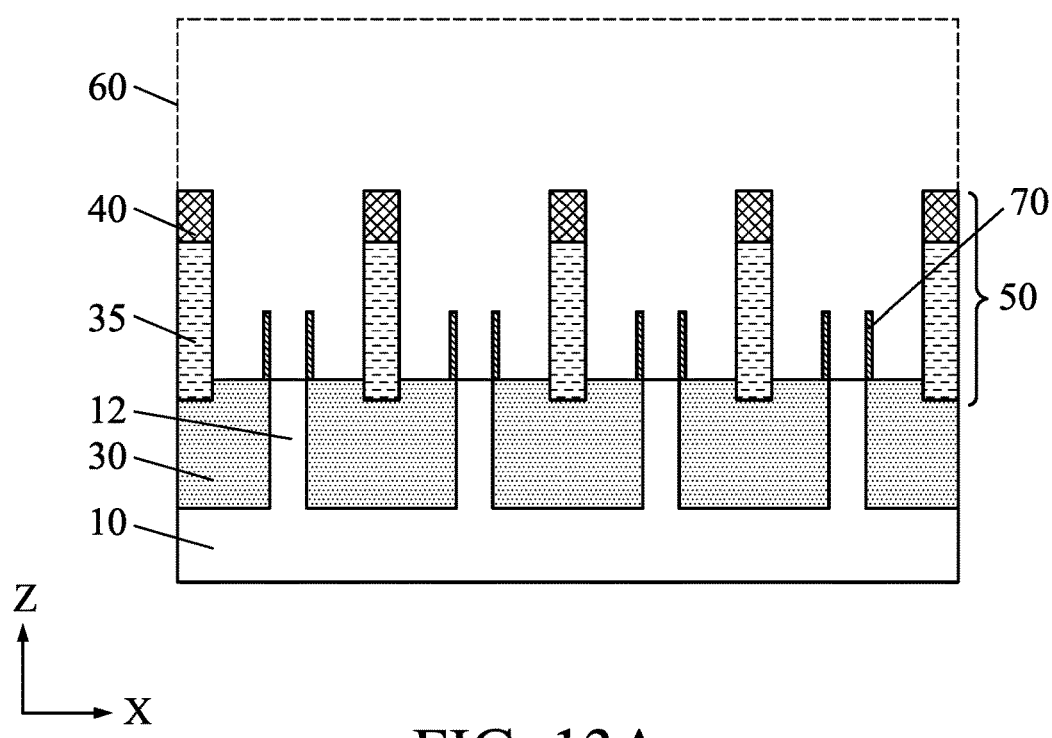
FIGS. 13A and 13B show one of the various stages of a sequential manufacturing operation of a semiconductor FET device according to an embodiment of the present disclosure.
Figure 13B:
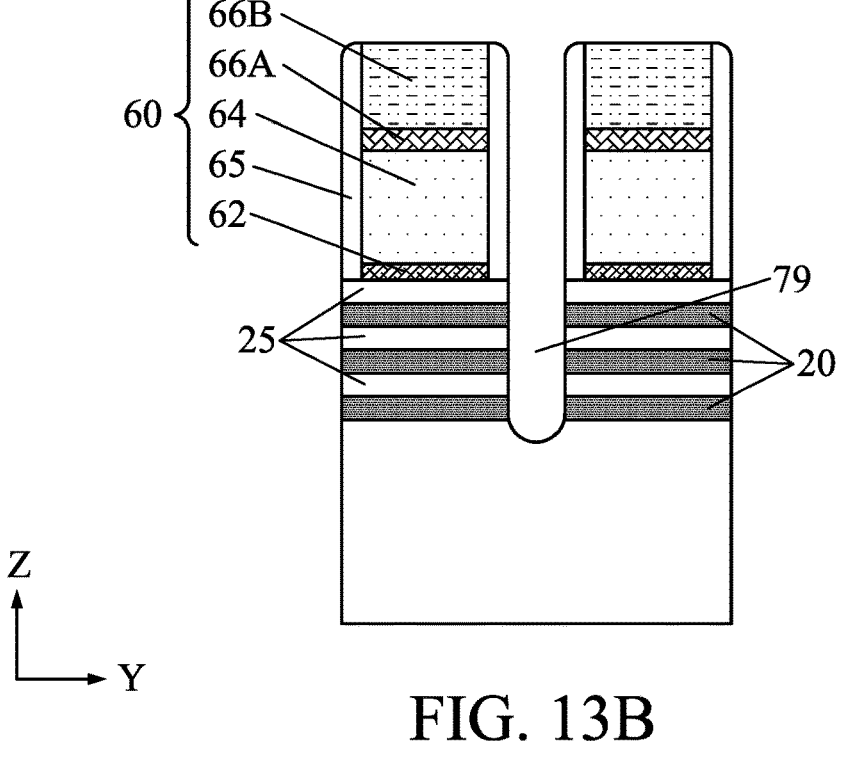

Further, as shown in FIGS. 13A and 13B, the source/drain region of the fin structure 29 is recessed by using a suitable etching operation to form a source/drain space 79. During the etching operation, the fin sidewalls 70 are also recessed below the top of the wall fin structure 50 as shown in FIG. 13A. FIG. 13B is a cross sectional view corresponding to line Y1-Y1 of FIG. 10B.

Figure 14A:
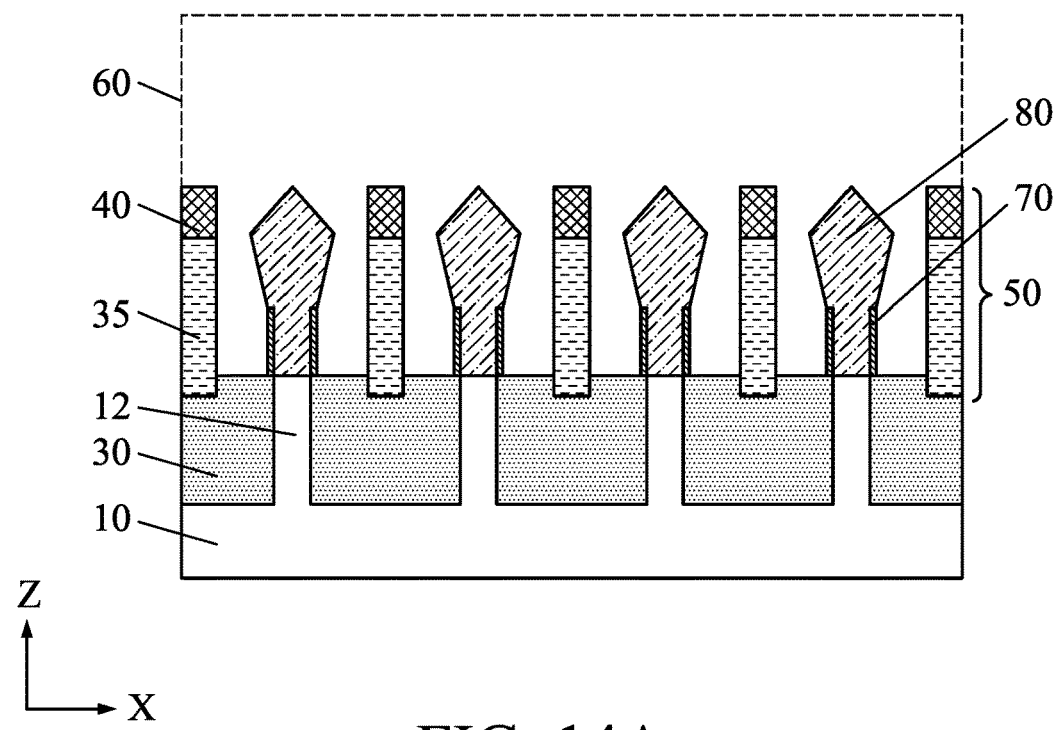
FIGS. 14A and 14B show one of the various stages of a sequential manufacturing operation of a semiconductor FET device according to an embodiment of the present disclosure.
Figure 14B:
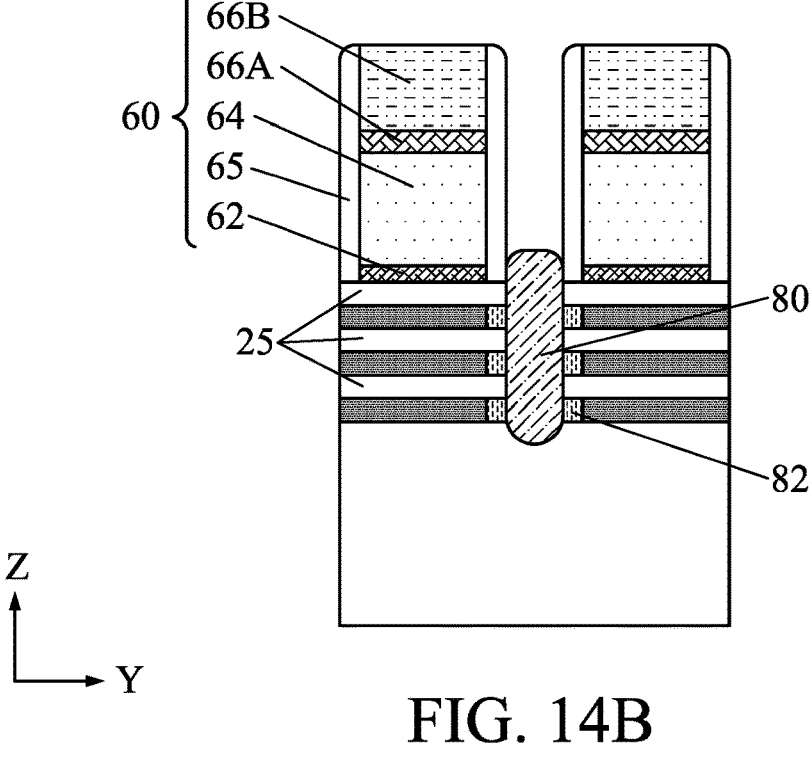

Subsequently, one or more source/drain epitaxial layers 80 are formed in the source/drain space 79 as shown in FIGS. 14A and 14B. FIG. 14B is a cross sectional view corresponding to line Y1-Y1 of FIG. 10B. In some embodiments, before the epitaxial layer 80 is formed, the first semiconductor layers 20 are laterally etched in the Y direction within the source/drain space 79, thereby forming cavities. When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. Next, an insulating layer is conformally formed on the etched lateral ends of the first semiconductor layers 20 and on end faces of the second semiconductor layers 25 in the source/drain space 79 and over the sacrificial gate structure 60. The insulating layer includes one of silicon nitride and silicon oxide, SiON, SiOC, SiCN and SiOCN, or any other suitable dielectric material. The insulating layer is made of a different material than the sidewall spacers 65 in some embodiments. The insulating layer is formed by ALD or any other suitable methods. By conformally forming the insulating layer, the cavities are fully filled with the insulating layer. In some embodiments, the insulating layer includes two or three layers made of different materials from each other. After the insulating layer is conformally formed, an etching operation is performed to partially remove the insulating layer, thereby forming inner spacers 82, as shown in FIG. 14B. In some embodiments, the end face of the inner spacers 82 is recessed more than the end face of the second semiconductor layers 25. The recessed amount is in a range from about 0.1 nm to about 2 nm and is in a range from about 0.2 nm to about 1 nm in other embodiments.

In some embodiments, the source/drain epitaxial layer 80 includes one or more layers of SiP, SiCP, SiC, SiCAs, SiAs and SiAsP for an n-type FET, and one or more layers of Si, SiGe, Ge, SiGeSn or GeSn for a p-type FET. For the p-type FET, the source/drain epitaxial layer 80 is doped with B (boron) and/or carbon in some embodiments. In some embodiments, the source/drain epitaxial layer 80 includes a first epitaxial layer and a second epitaxial layer having a different P (and/or As) concentration. In some embodiments, the amount of P (and/or As) is in a range from about $1\times10^{20}$ atoms·cm$^{-3}$ to about $1\times10^{21}$ atoms·cm$^{-3}$, and is in a range from about $2\times10^{20}$ atoms·cm$^{-3}$ to about $6\times10^{20}$ atoms·cm$^{-3}$ in other embodiments. In some embodiments, the amount of P (and/or As) in the second epitaxial layer is greater than the amount of P in the first epitaxial layer. The amount of P in the second epitaxial layer is in a range from about $1\times10^{21}$ atoms·cm$^{-3}$ to about $5\times10^{21}$ atoms·cm$^{-3}$ in some embodiments, and is in a range from about $2\times10^{21}$ atoms·cm$^{-3}$ to about $4\times10^{21}$ atoms·cm$^{-3}$ in other embodiments. In other embodiments, the source/drain epitaxial layer 80 includes a first epitaxial layer and a second epitaxial layer having a different Ge (and/or B) concentration. In some embodiments, a germanium amount of the second epitaxial layer is greater than a germanium amount of the first epitaxial layer. In some embodiments, the Ge amount of the first epitaxial layer is in a range from about 20 atomic % to 40 atomic % and the Ge amount of the second epitaxial layer is in a range from about 35 atomic % to about 50 atomic %. In some embodiments, the SiGe epitaxial layers contain boron as dopant. In some embodiments, a boron concentration of the second epitaxial layer is greater than a boron concentration of the first epitaxial layer. The amount of B in the first epitaxial layer is in a range from about $1\times10^{20}$ atoms·cm$^{-3}$ to about $5\times10^{20}$ atoms·cm$^{-3}$, and the amount of B in the second epitaxial layer is in a range from about $5\times10^{20}$ atoms·cm$^{-3}$ to about $1\times10^{21}$ atoms·cm$^{-3}$ in other embodiments.

In some embodiments, the source/drain epitaxial layer 80 is separated from the wall fin structure 50 and in other embodiments, the source/drain epitaxial layer 80 touches the wall fin structure 50.

Figure 15A:
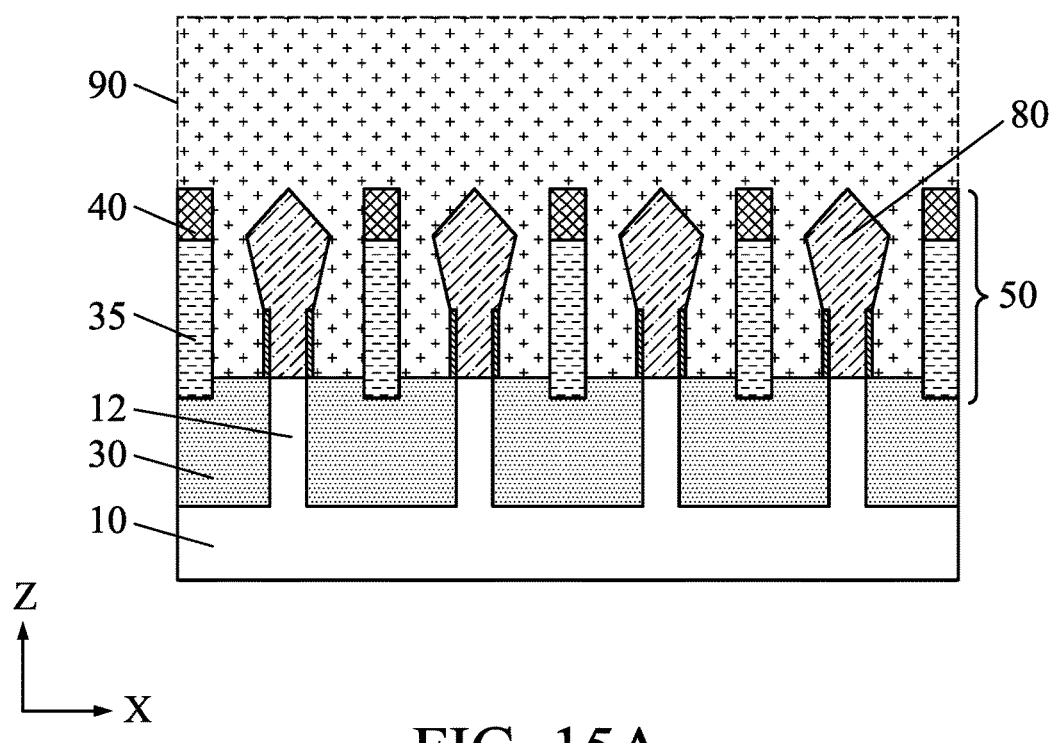
FIGS. 15A and 15B show one of the various stages of a sequential manufacturing operation of a semiconductor FET device according to another embodiment of the present disclosure.
Figure 15B:
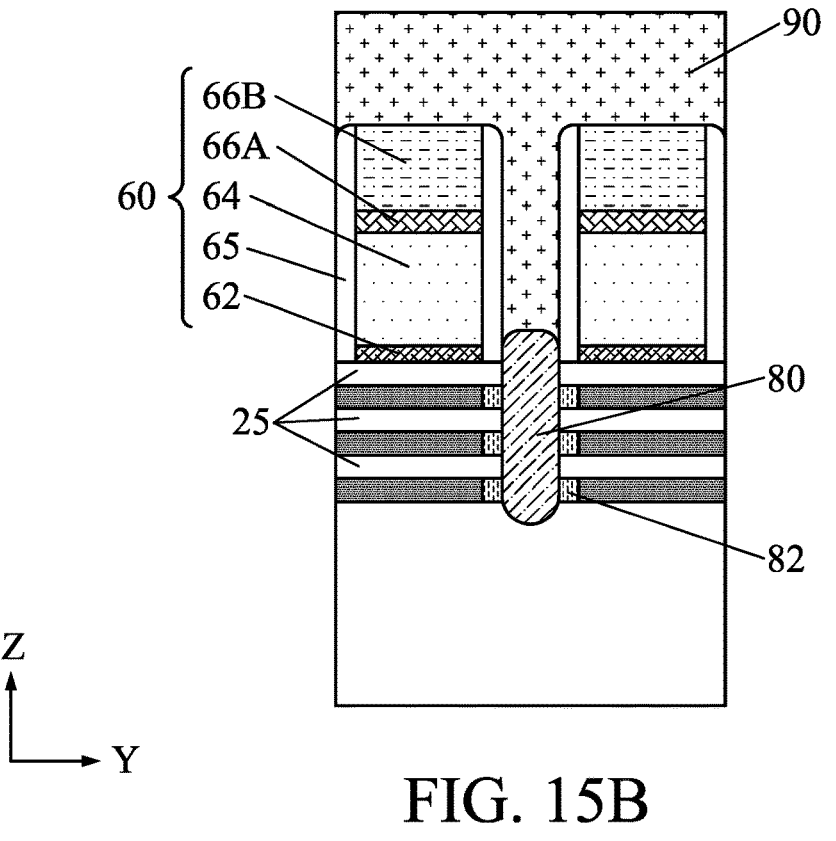
Figure 19:
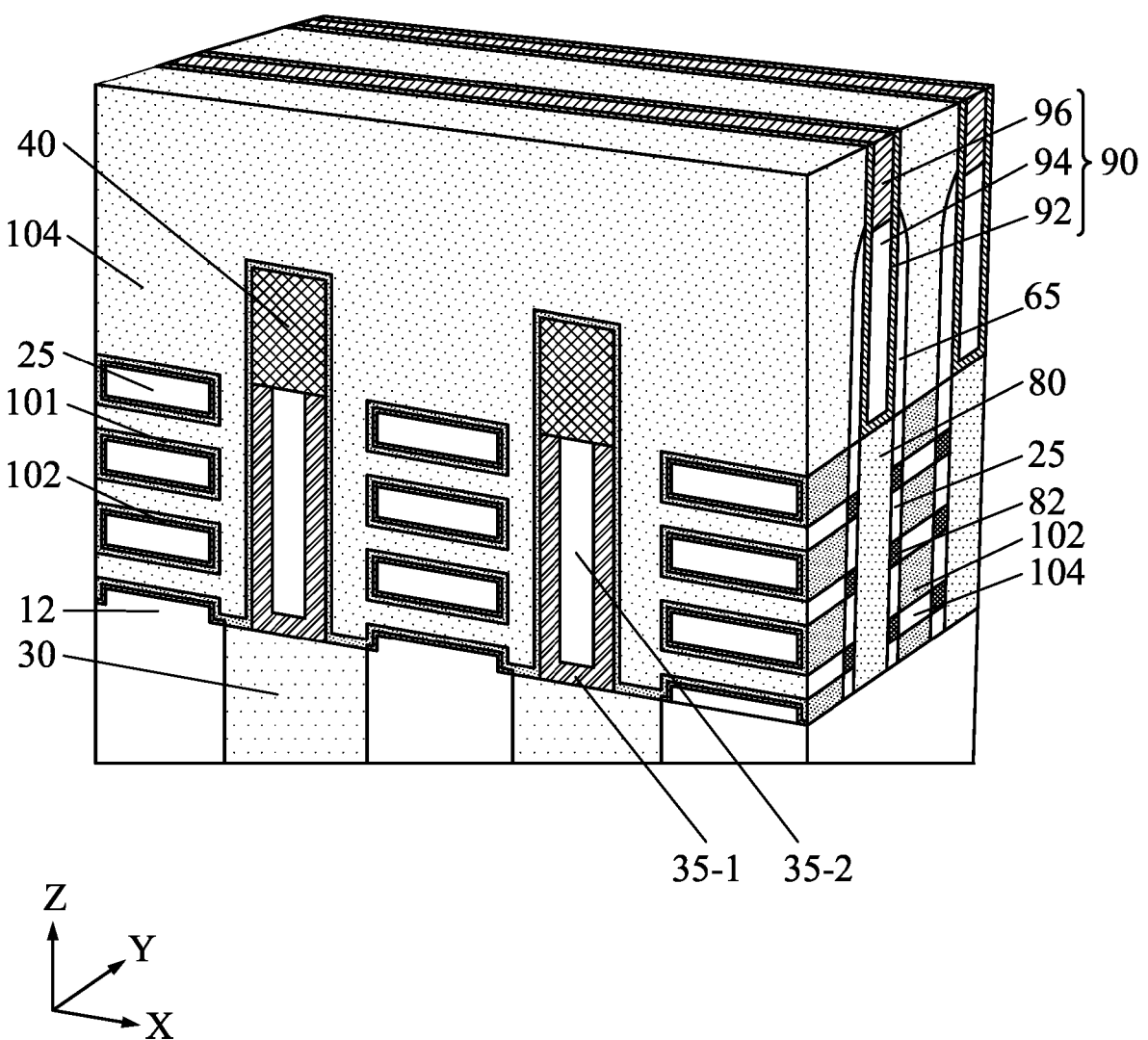
FIGS. 19, 20, 21, 22, 23, 24, 25 and 26 show various stages of a sequential manufacturing operation of a semiconductor FET device according to an embodiment of the present disclosure.

Then, one or more interlayer dielectric (ILD) layers 90 is formed over the source/drain epitaxial layer 80 and the sacrificial gate structure 60 as shown in FIGS. 15A and 15B. The materials for the ILD layer 90 include compounds comprising Si, O, C and/or H, such as silicon oxide, SiCOH and SiOC. Organic materials, such as polymers, may be used for the ILD layer 90. In some embodiments, the ILD layer 90 includes an insulating liner layer 92 functioning as an etch stop layer, a main ILD layer 94, and an additional dielectric layer 96 as shown in FIG. 19. In some embodiments, the layers 92 and 96 include silicon nitride, and the layer 94 includes compounds comprising Si, O, C and/or H, such as silicon oxide, SiCOH and SiOC.

Figure 16A:
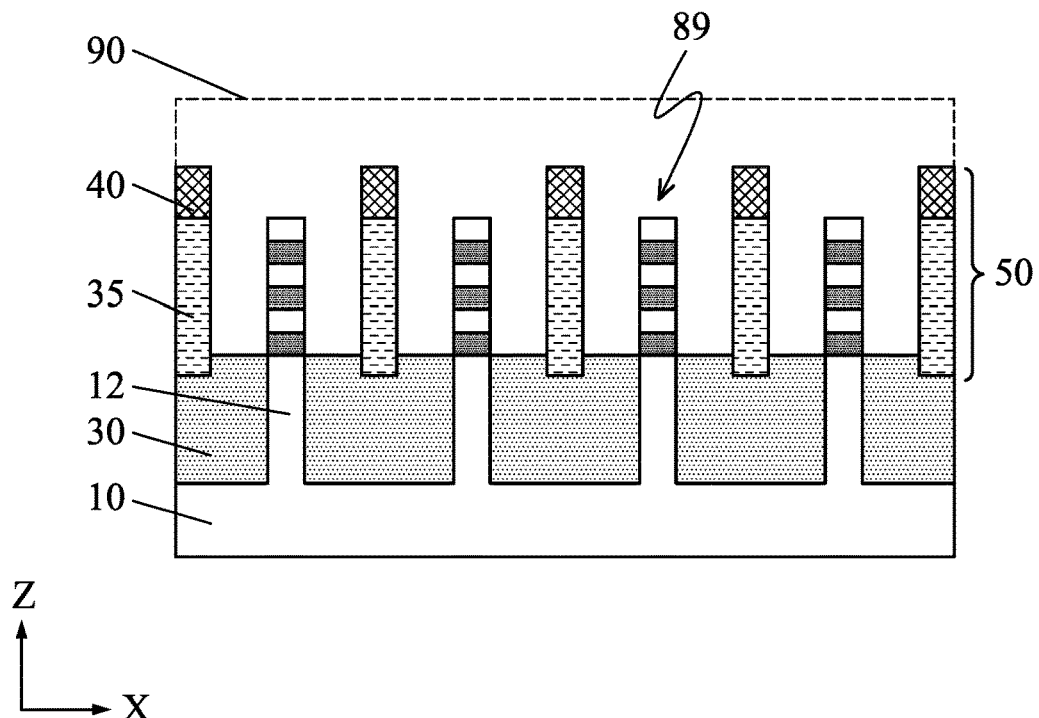
FIGS. 16A and 16B show one of the various stages of a sequential manufacturing operation of a semiconductor FET device according to another embodiment of the present disclosure.
Figure 16B:
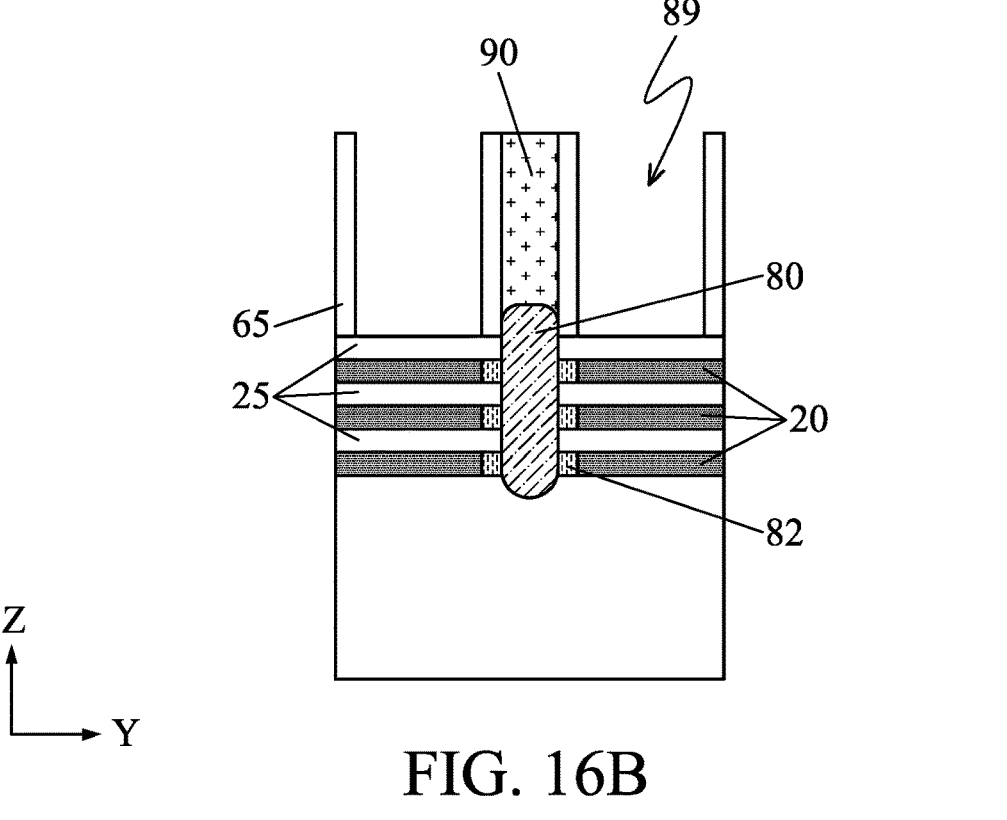

After the ILD layer 90 is formed, a planarization operation, such as CMP, is performed, so that the top portion of the sacrificial gate electrode layer 64 is exposed. Then, the sacrificial gate electrode layer 64 and the sacrificial gate dielectric layer 62 are removed, thereby forming a gate opening 89, as shown in FIGS. 16A and 16B. FIG. 16A corresponds to line X1-X1 of FIG. 10B.

The sacrificial gate structures can be removed using plasma dry etching and/or wet etching. When the sacrificial gate electrode layer 64 is polysilicon and the ILD layer 90 is silicon oxide, a wet etchant such as a tetramethylammonium hydroxide (TMAH) solution can be used to selectively remove the sacrificial gate electrode layer 64. The sacrificial gate dielectric layer 62 is thereafter removed using plasma dry etching and/or wet etching.

Figure 17A:
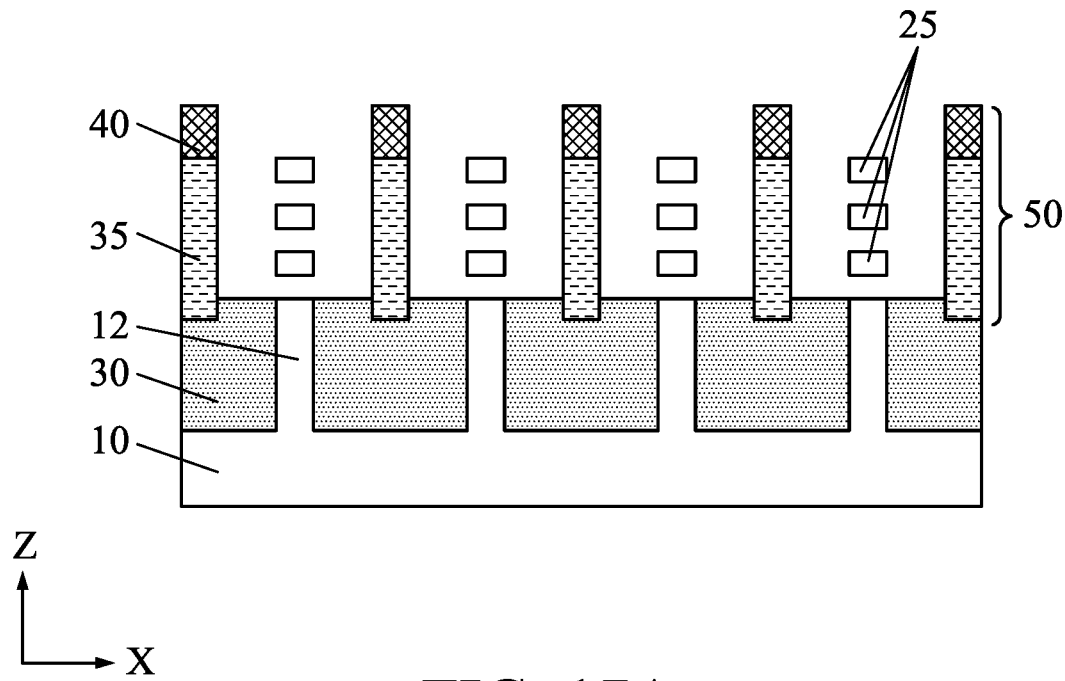
FIGS. 17A and 17B show one of the various stages of a sequential manufacturing operation of a semiconductor FET device according to an embodiment of the present disclosure.
Figure 17B:
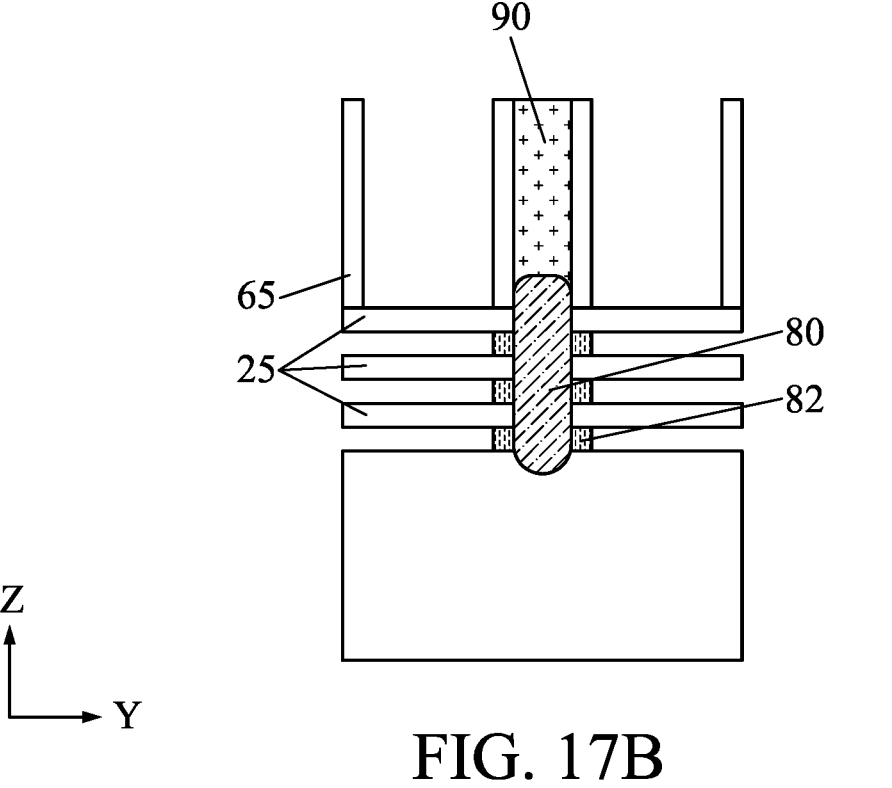

After the sacrificial gate electrode layer 64 and the sacrificial gate dielectric layer 62 are removed, the first semiconductor layers 20 are removed, thereby forming nanosheets or nanowires (channel regions) of the second semiconductor layers 25, as shown in FIGS. 17A and 17B. The first semiconductor layers 20 can be removed or etched using an etchant that can selectively etch the first semiconductor layers 20 against the second semiconductor layers 25, as set forth above. As shown in FIG. 17B, since the first insulating layers (inner spacers) 82 are formed, the etching of the first semiconductor layers 20 stops at the inner spacers 82. In other words, the inner spacers 82 function as an etch-stop layer for etching of the first semiconductor layers 20.

Figure 18A:
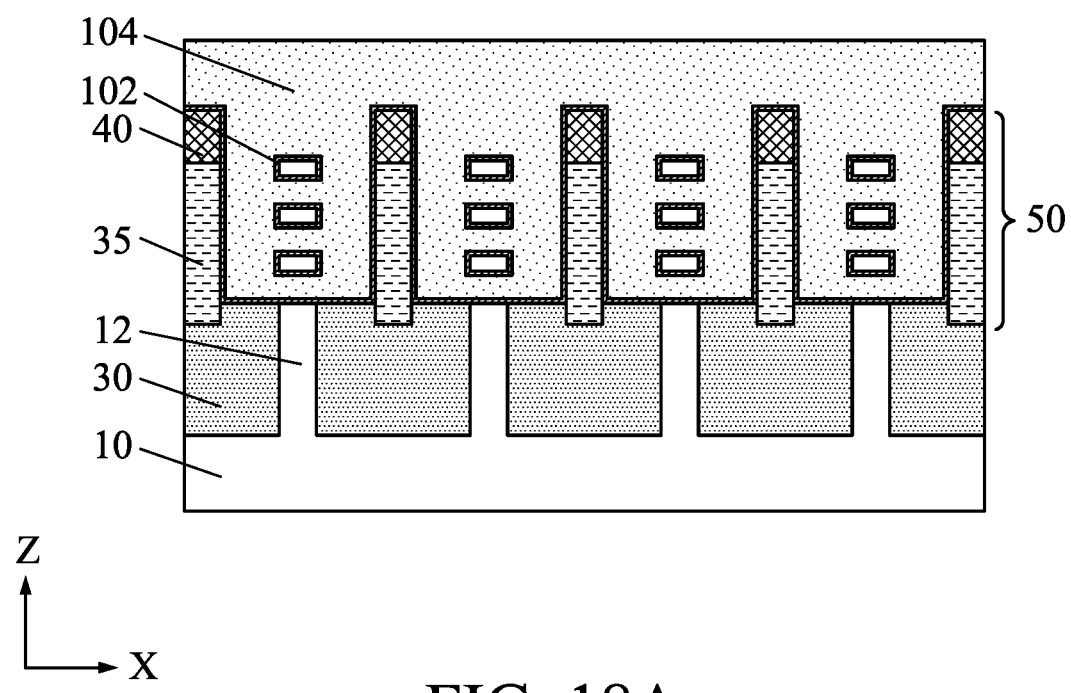
FIGS. 18A, 18B and 18C show one of the various stages of a sequential manufacturing operation of a semiconductor FET device according to an embodiment of the present disclosure.
Figure 18B:
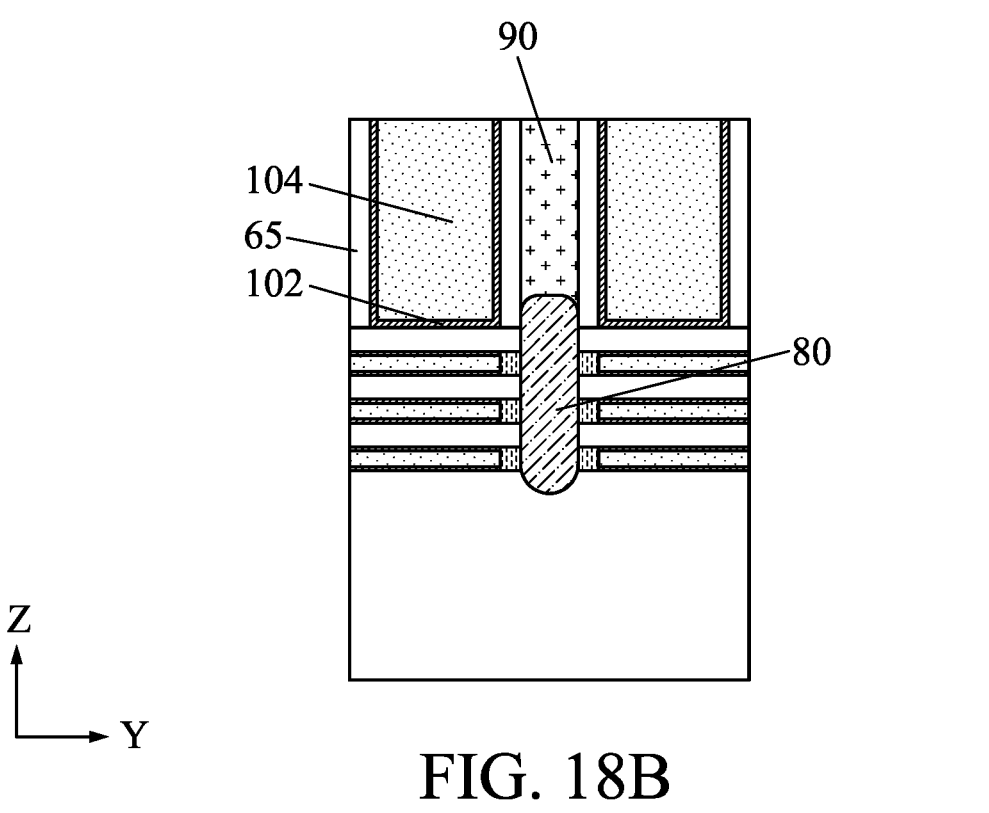

After the semiconductor nanosheets or nanowires (channel regions) of the second semiconductor layers 25 are formed, a gate dielectric layer 102 is formed around each channel region, as shown in FIGS. 18A and 18B. In some embodiments, the gate dielectric layer 102 includes one or more layers of a dielectric material, such as silicon oxide, silicon nitride, or a high-k dielectric material, other suitable dielectric material, and/or combinations thereof. Examples of high-k dielectric materials include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 102 includes an interfacial layer formed between the channel layer and the dielectric material by using chemical oxidation. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layer. The thickness of the gate dielectric layer 102 is in a range from about 1 nm to about 10 nm in one embodiment. In some embodiments, an interfacial layer 101 formed by chemical oxidation of the channel region 25 is formed before the gate dielectric layer 102 is formed, as shown in FIG. 19.

Figure 18C:
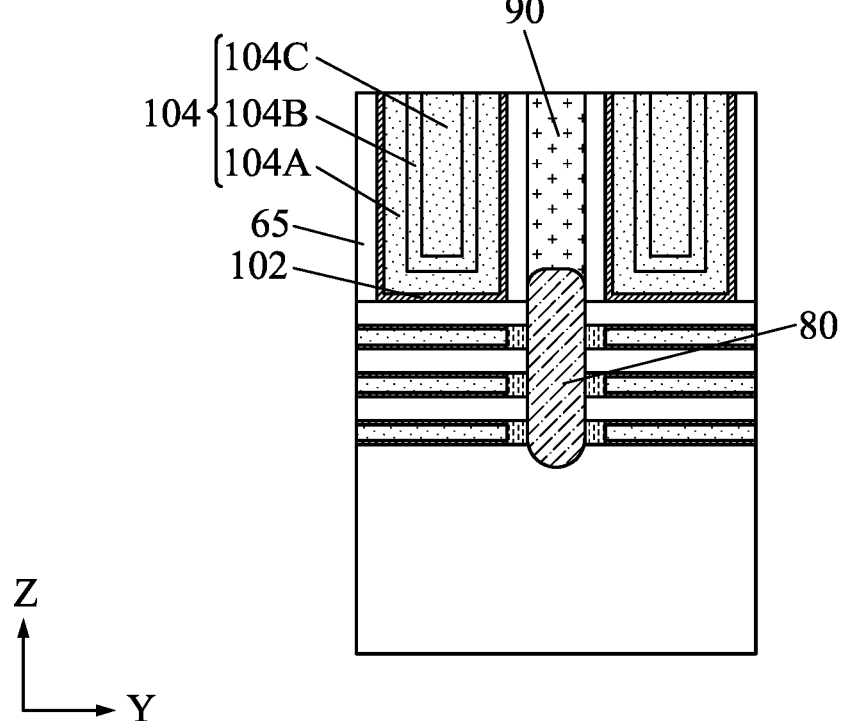

Further, one or more conductive layers 104 are formed over the gate dielectric layer 102, as shown in FIGS. 18A and 18B. In some embodiments, the conductive layers 104 include one or more work function adjustment layers 104A and 104B, as shown in FIG. 18C. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. In some embodiments, the layer 104A is a p-type work function metal (WFM) layer and the layer 104B is an n-type WFM layer, or vice versa. In some embodiments, only one of the layers 104A or 104B is formed. The work function adjustment layer may be formed by ALD, PVD, CVD, e-beam evaporation, electroplating or other suitable process. Further, the work function adjustment layer may be formed separately for the n-channel FET and the p-channel FET, which may use different metal layers. In some embodiments, the conductive layers 104 further include one or more additional layer 104C, such as barrier layers (e.g., Ti, TiN, Ta and/or TaN) formed below or within the work function adjustment layers and/or a glue layer (e.g., TiN) formed above the work function adjustment layers. The conductive layers 104 may be formed by ALD, PVD, CVD, e-beam evaporation, electroplating or other suitable process.

In some embodiments, the conductive layers 104 fully fill the gate space as shown in FIGS. 18A and 18B. In some embodiments, one or more conductive layers are formed in the gate space and over the ILD layer 90, and one or more planarization operations, such as CMP, are performed to remove excess material over the ILD layer 90.

FIGS. 19-27A show isometric or perspective views of various stages of the sequential manufacturing operation of the FET device according to the present disclosure. FIGS. 27B and 28A are cross sectional views along line X1-X1 of FIG. 10B, and FIGS. 27C and 28B are cross sectional views along line Y1-Y1 of FIG. 10B.

As shown in FIGS. 18A, 18B and 19, the conductive layers 104 are formed around the channel regions 25 wrapped around by the interfacial layer 101 and the gate dielectric layer 102, and cover the wall fin structure 50. As shown in FIG. 19, the ILD layer 90 including a first layer 92 as an etch stop layer, a second layer 94 and a third 96 is disposed over the source/drain epitaxial layer 80. The wall fin structure 50 is disposed between the adjacent stacked channel regions 25 and between the adjacent source/drain epitaxial layers 80 (see, FIG. 15A). In some embodiments, before the conductive layers 104 are formed, the gate sidewall spacers 65 are recessed down below the top of the ILD layer 90.

Figure 20:
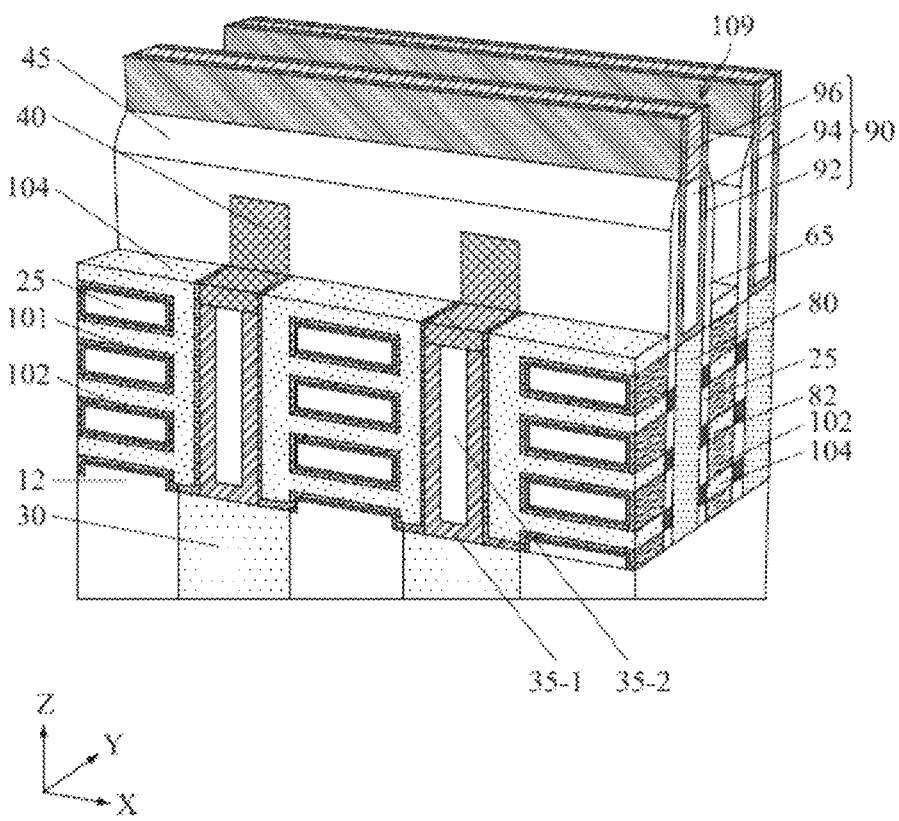

Then, as shown in FIG. 20, the conductive layer 104 is recessed to form a gate space 109. In some embodiments, the third dielectric layer 40 of the wall fin structure 50 is also recessed. In some embodiments, the gate dielectric layer 102 formed over the gate sidewall spacers 65 is also recessed. In some embodiments, the conductive layer 104 is recessed so that the remaining thickness of the conductive layer 104 above the uppermost channel region 25 is in a range from about 1 nm to about 10 nm. In some embodiments, the third dielectric layer 40 of the wall fin structure 50 is recessed to the same level as the conductive layer 104. In other embodiments, the conductive layer 104 is recessed (etched) more than the third dielectric layer 40 and the bottom of the gate space 109 is uneven. In some embodiments, the recessing the conductive layer 104 and the third dielectric layer 40 includes two or more etching operations, one of which is for etching the conductive layer 104 and another of which is for etching the third dielectric layer 40. By the recess etching, a part of the gate dielectric layer 45 is exposed in the gate space 109.

Figure 21:
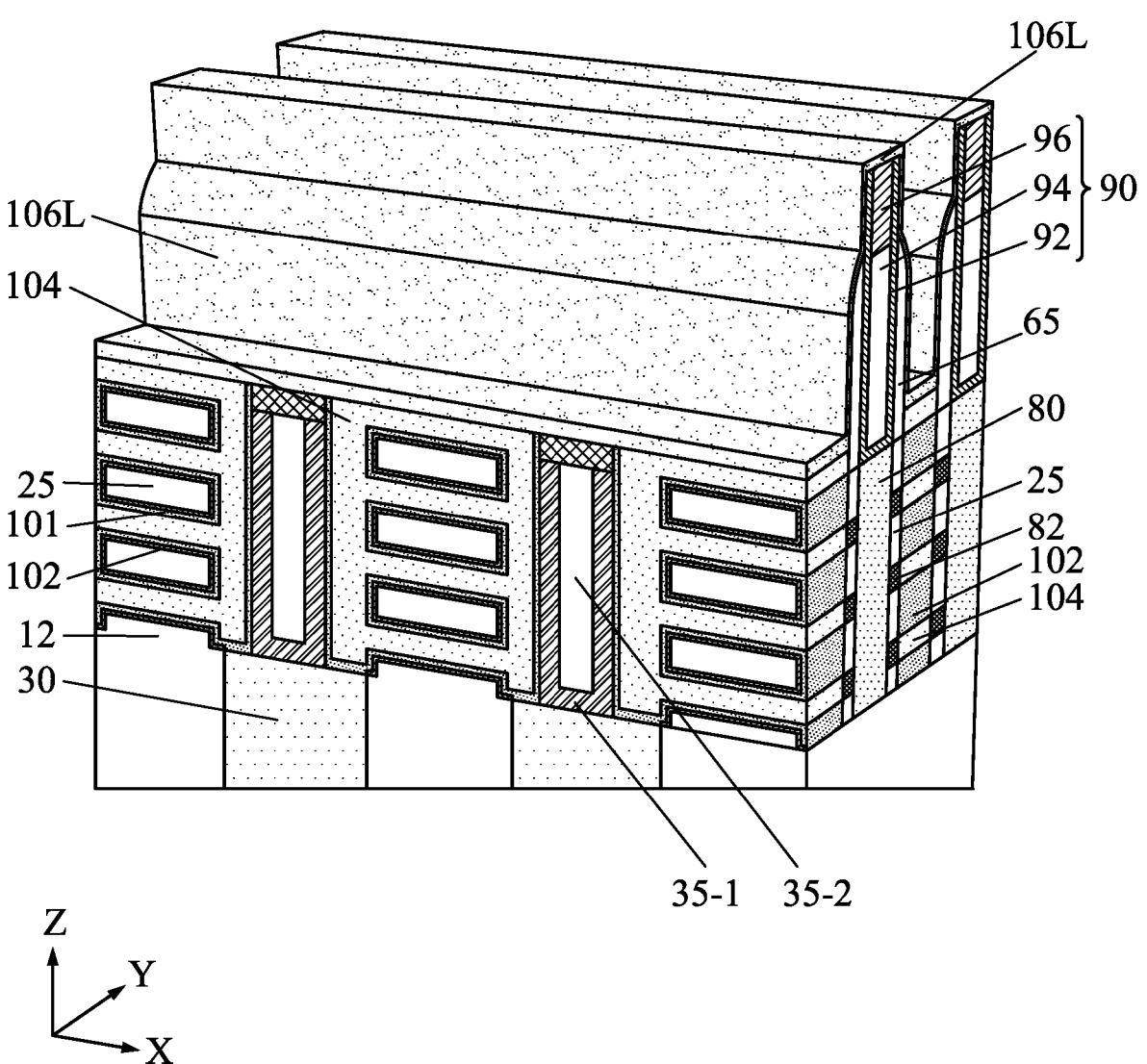

Next, as shown in FIG. 21, a blanket conductive layer 106L for a body gate electrode layer is formed over the recessed conductive layer 104, the gate sidewall spacers 65 and the ILD layer 90 (the first layer 92 and the third layer 96). In some embodiments, the blanket conductive layer 106L is formed by physical vapor deposition (PVD), such as a sputtering process. In some embodiments, the thickness of the blanket conductive layer 106L as deposited on the recessed conductive layer 104 is greater than the thickness on the gate sidewall spacers 65. In some embodiments, the ratio of the thickness of the blanket conductive layer 106L as deposited on the recessed conductive layer 104 to the thickness thereof on the gate sidewall spacers 65 is in a range from about 2.3 to about 3.0. In some embodiments, the thickness of the blanket conductive layer 106L as deposited on the recessed conductive layer 104 is equal to or smaller than the thickness on the upper surface of the ILD layer 90.

In some embodiments, the blanket conductive layer 106L includes a metal, such as W, Ti, Ta, Co, Ni, Mo, Ru, Cu, Al or alloy thereof. In some embodiments, the blanket layer 106L is made of W.

In the PVD (sputtering) process, when the ion density is greater, deposition on the gate sidewall spacers 65 is suppressed. In some embodiments, the sputtering process is performed at a temperature in a range from about 25° C. to about 500° C., at a pressure in a range from about 20 mTorr to about 500 mTorr, with an RF power in a range from about 2 kW to about 4 kW and with a RF bias in a range from about 50 V to 300V. In some embodiments, the blanket layer 106L is free from chlorine and fluorine (less than the detectable limit). If CVD or ALD using metal fluoride and/or metal chloride are used to form a conductive layer (e.g., W layer), a conductive layer contains fluorine and/or chlorine, for example in an amount more than 0.1 ppm.

Figure 22:
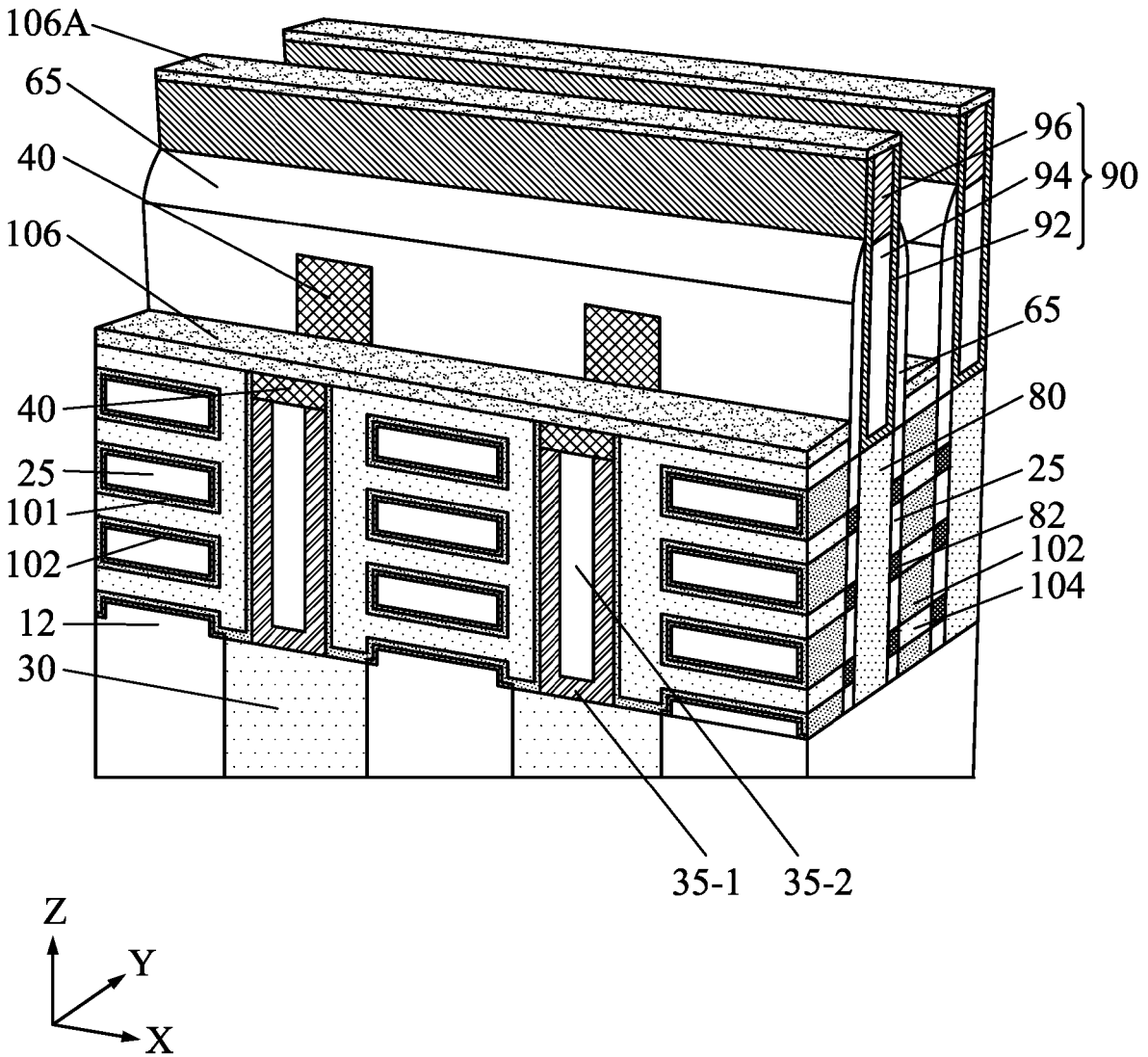

Then, as shown in FIG. 22, part of the blanket conductive layer 106L deposited on the gate sidewall spacers 65 (vertical sides) is removed. In some embodiments, a wet etching process using de-ionized water, ozone water, $H_2O_2$, acid (HF, HCl, $H_2SO_4$, $H_3PO_4$, etc.), and/or ammonia water is used. In some embodiments, the wet etchant is a mixture of $NH_4OH$, $H_2O_2$ and $H_2O$ or a mixture of HCl, $H_2O_2$ and $H_2O$. In some embodiments, a dry etching process using a fluorine containing gas (e.g., $CF_4$), chlorine containing gas ($BCl_3$), etc. followed by the wet etching process as set forth above is used. In some embodiments, a directional etching process is used to remove the portion of the blanket layer 106L on the gate sidewall spacers 65. In the directional etching process, active species are applied at an angle of about 10 degrees to about 60 degrees with respect to the upper surface of the ILD layer 90.

As shown in FIG. 22, after the portion of the blanket layer 106L on the gate sidewall spacers 65 is removed, portions of the blanket layer 106L on the conductive layer 104 (106) and the upper surface of the ILD layer 90 (106A) remain. The thickness of the remaining conductive layer on the conductive layer 104, i.e. a body gate electrode layer 106, is in a range from about 2 nm to about 8 nm in some embodiments, and is in a range from about 3 nm to about 6 nm in other embodiments. In some embodiments, the flatness of the upper surface of the body gate electrode layer 106 (peak-to-bottom of the upper surface) is in a range from about 0.1 nm to about 1 nm.

Figure 23:
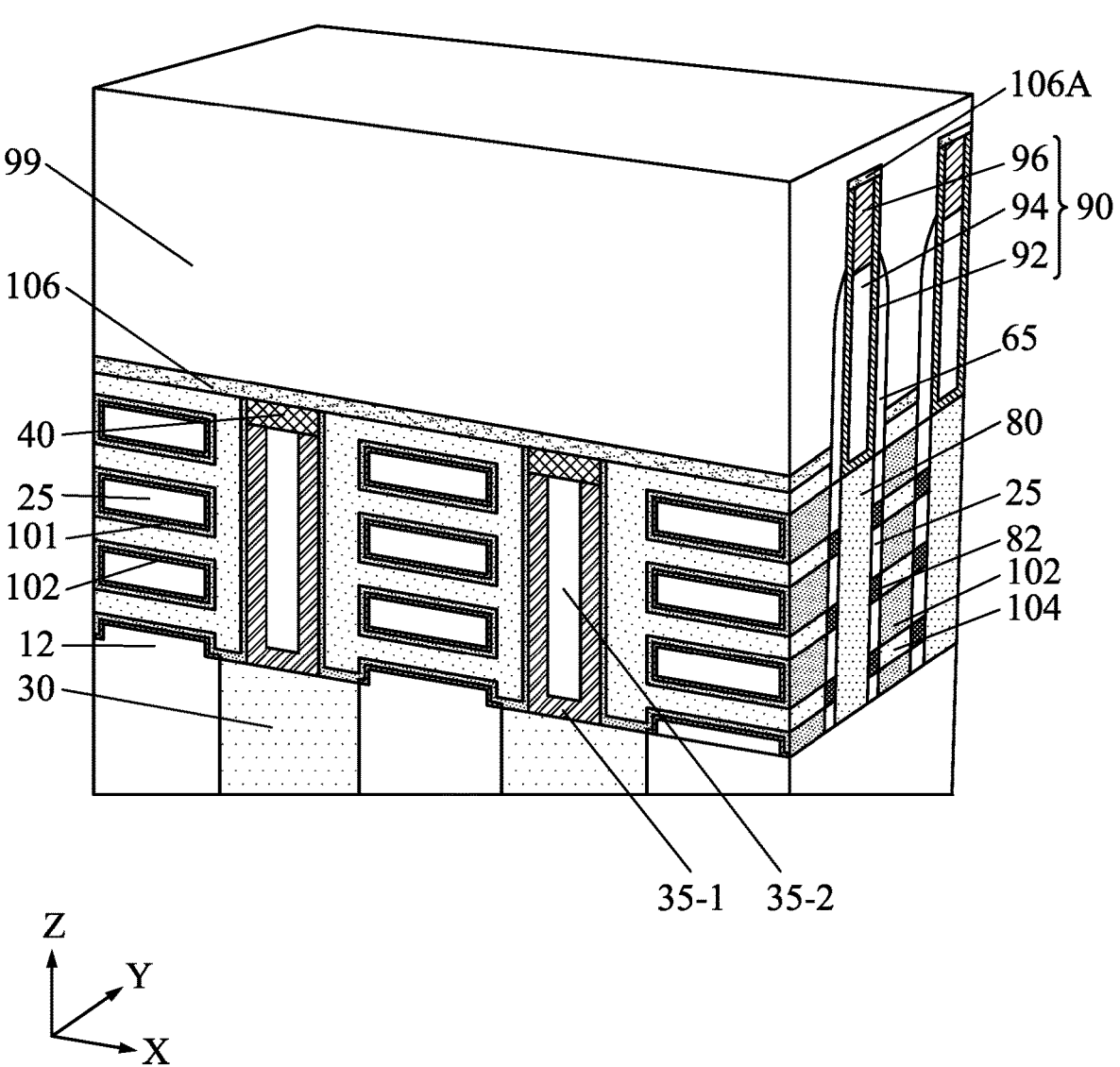

Next, as shown in FIG. 23, a filling material layer 99 is formed in the gate space 109 and on the upper surface of the ILD layer 90 on which the remaining blanket layer 106A remains. In some embodiments, the filling material layer 99 includes an organic material, such as polymer. In some embodiments, the filling material layer 99 is a photo resist layer or a bottom antireflective coating (BARC) layer.

Figure 24:
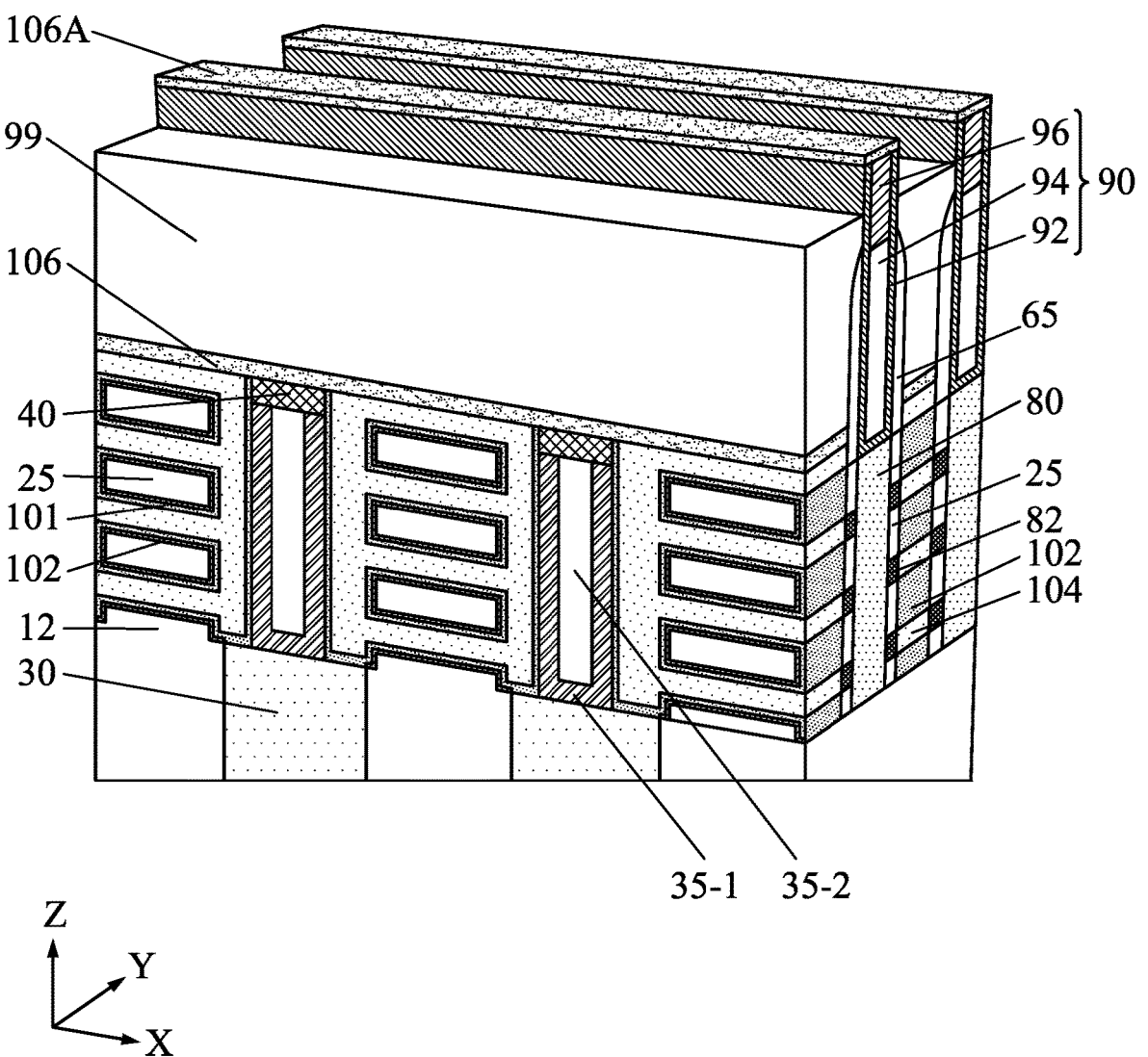

Then, as shown in FIG. 24, the filling material layer 99 is recessed by an etching-back operation to expose the remaining blanket layer 106A on the upper surface of the ILD layer 90, while protecting the body gate electrode layer 106 by the filling material layer 99.

Figure 25:
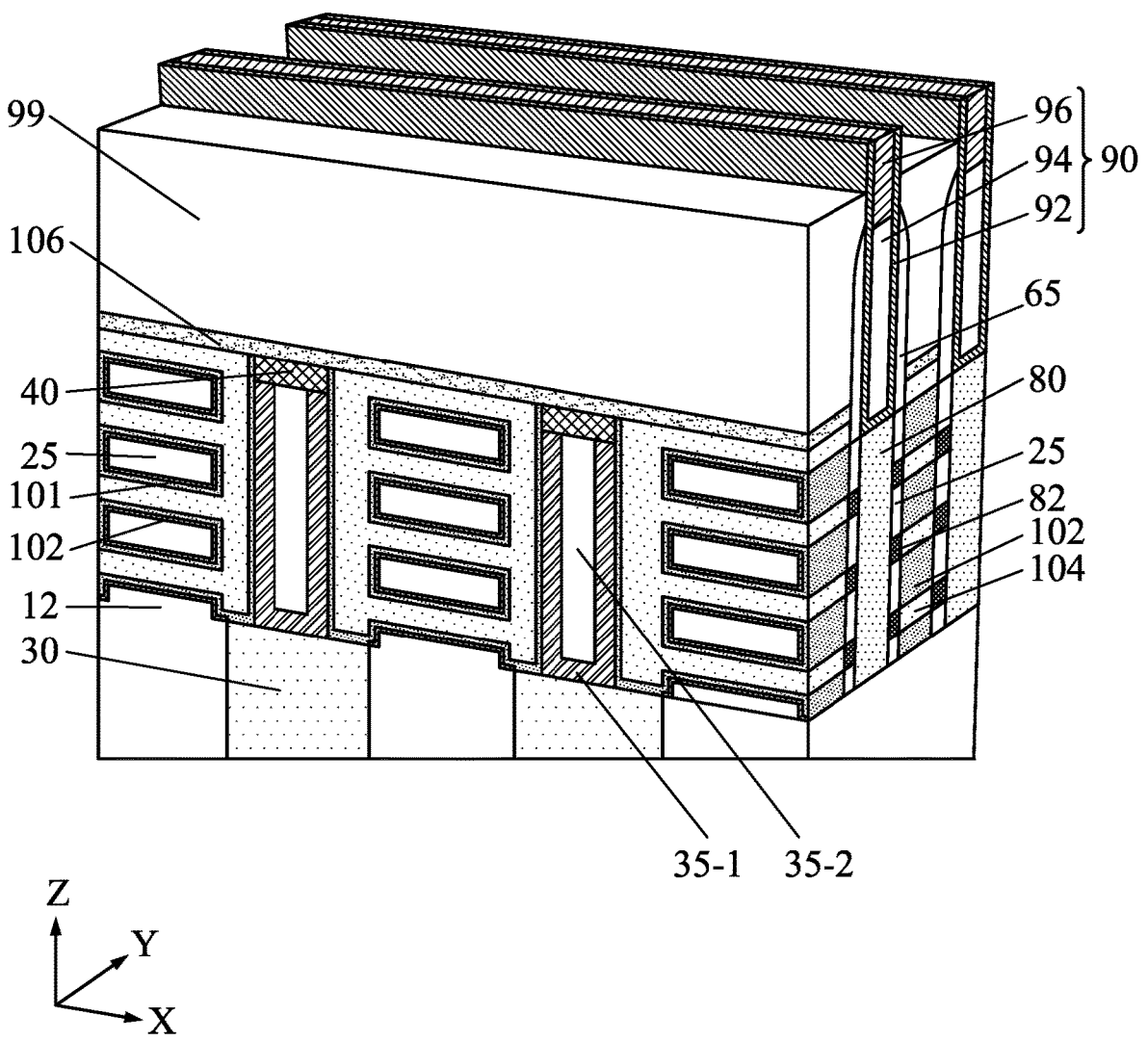
Figure 26:
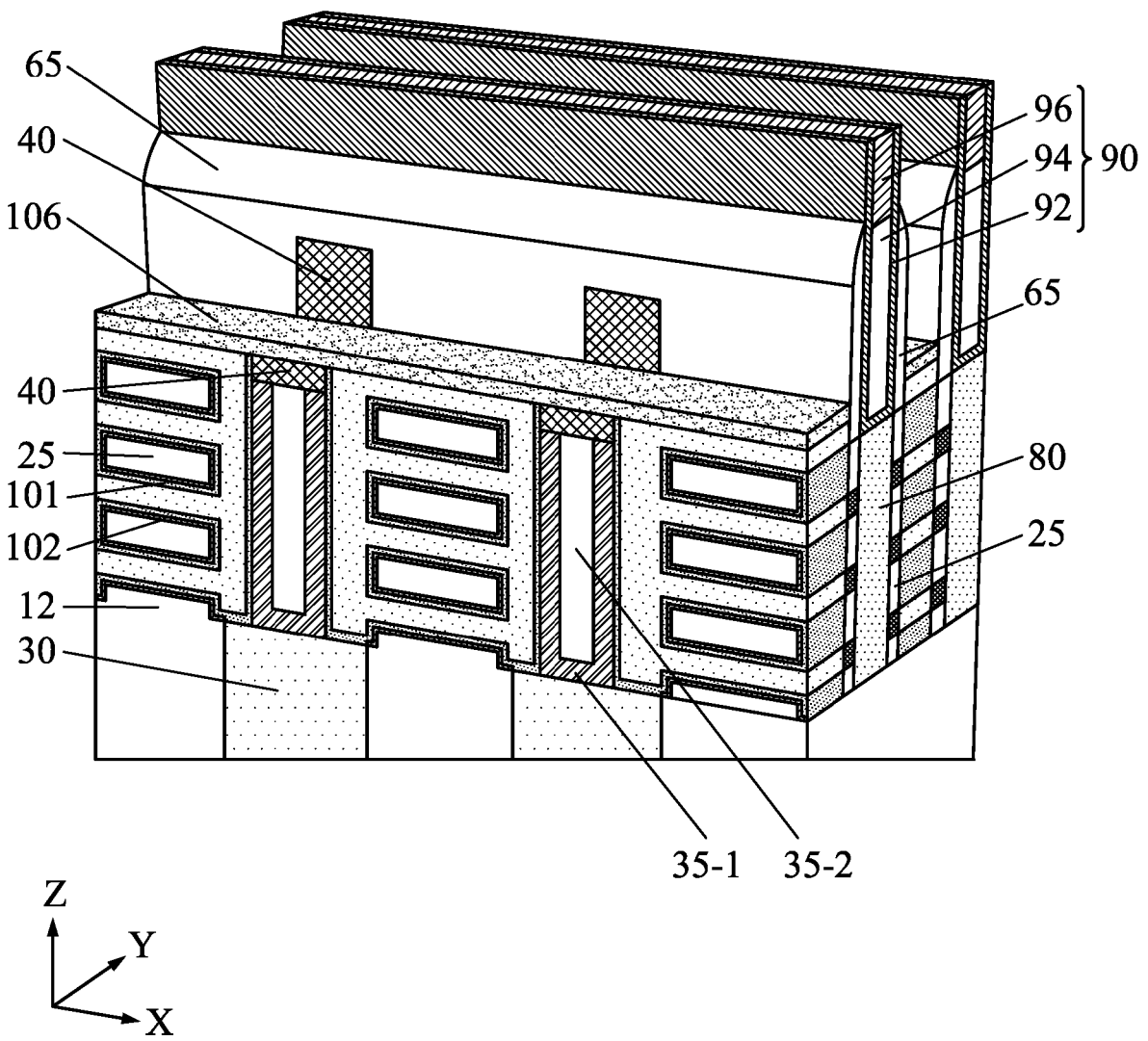

Further, the remaining blanket layer 106A on the upper surface of the ILD layer 90 is removed by the wet etching operation and/or the dry etching operation as set forth above, as shown in FIG. 25, and then the filling material 99 in the gate space 109 is removed as shown in FIG. 26.

Figure 27A:
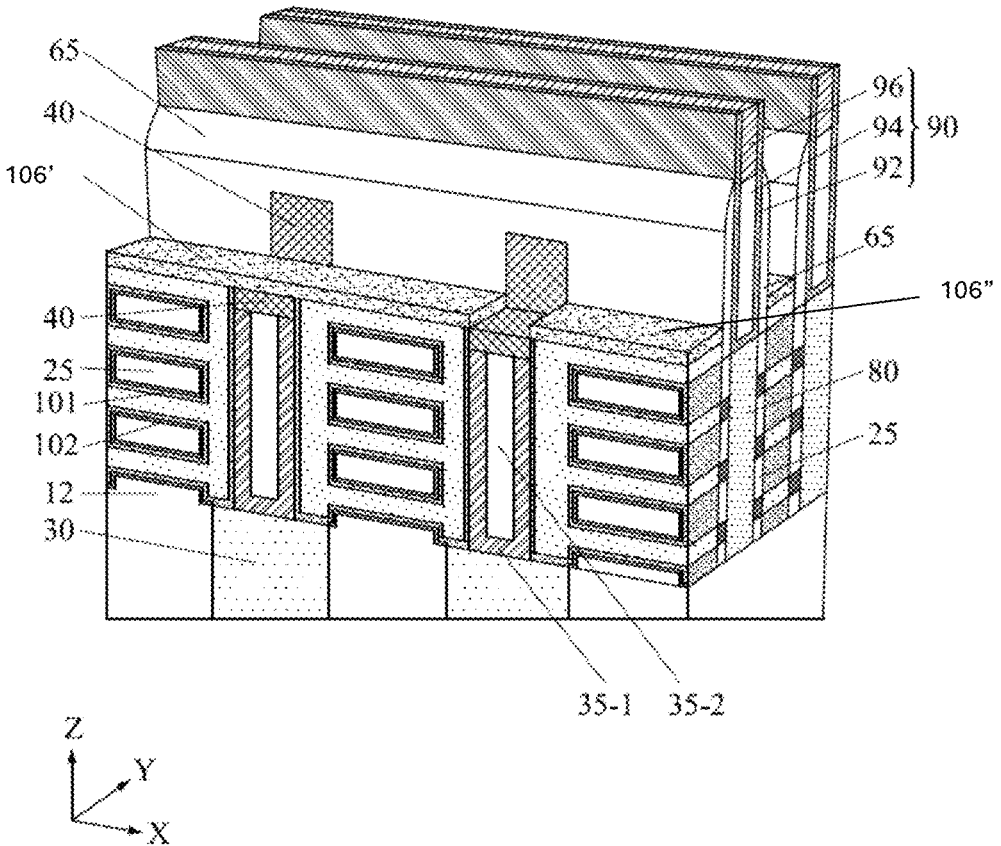
FIGS. 27A, 27B and 27C show one of the various stages of a sequential manufacturing operation of a semiconductor FET device according to an embodiment of the present disclosure.
Figure 27B:
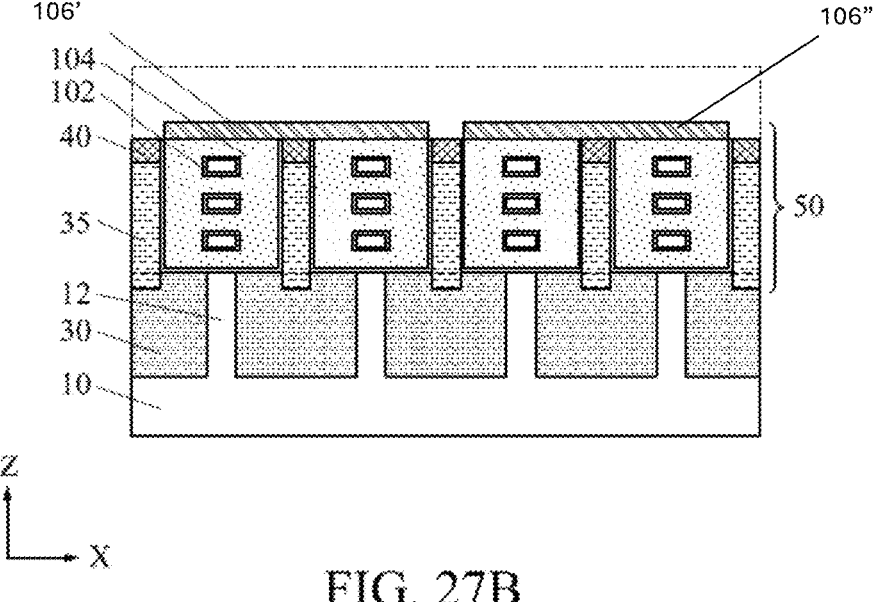
Figure 27C:
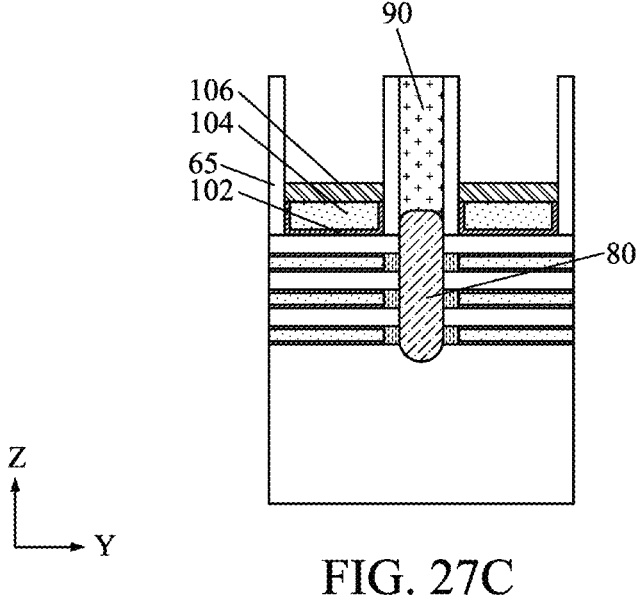
Figure 28A:
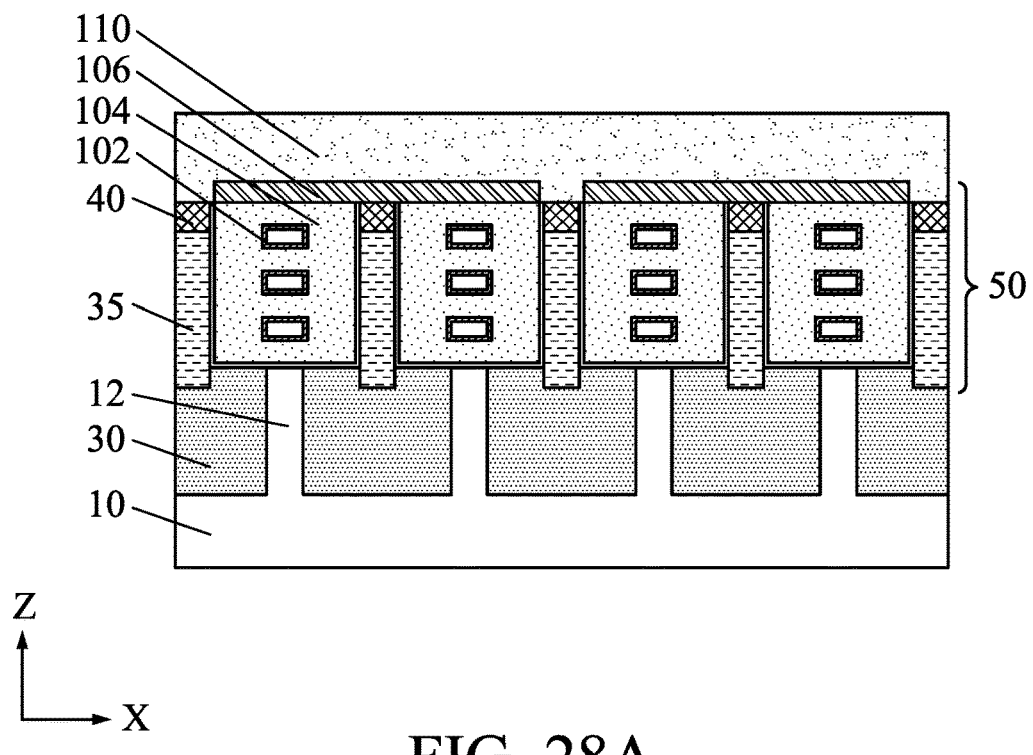
FIGS. 28A and 28B show one of the various stages of a sequential manufacturing operation of a semiconductor FET device according to an embodiment of the present disclosure.
Figure 28B:
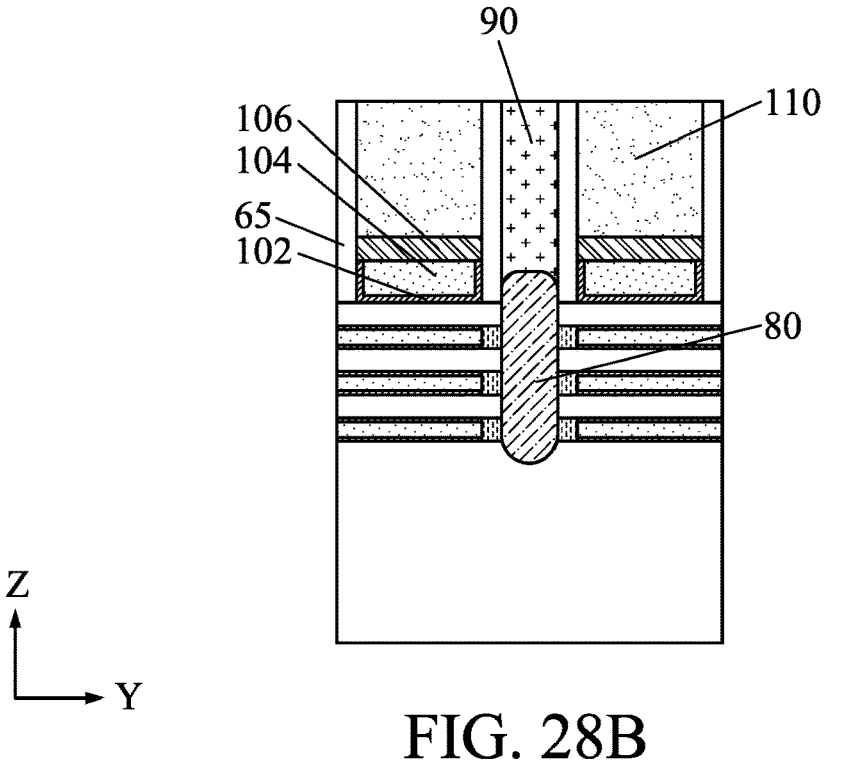

Further, as shown in FIGS. 27A-27C, the body gate electrode layer 106 is patterned into separate gate electrode layers 106', 106" within the gate space. In some embodiments, one of the separated gate electrode layers 106', 106" is used for a gate electrode of a CMOS device (e.g., left two FETs are p-type FETs and right two FETs are n-type FETs in FIG. 27B). In some embodiments, one of the separated gate electrode layers 106 is used for two or more FETs of the same conductivity. In some embodiments, the cutting point of the gate electrode layer 106 is located above the third dielectric layer 40 of the wall fin structure 50. In some embodiments, a part of the body gate electrode layer 106 is exposed at the cutting point. In some embodiments, no part of the body gate electrode layer 106 is exposed at the cutting point.

After the gate cutting process as shown in FIGS. 27A-27C, one or more dielectric layers 110 (e.g., silicon oxide, silicon nitride, SiON, SiOC, SiOCN, etc.) as a gate cap insulating layer is formed on the body gate electrode layers 106, as shown in FIGS. 28A and 28B. The cap insulating layer 110 can be formed by depositing an insulating material followed by a planarization operation.

It is understood that the FET undergoes further CMOS processes to form various features such as contacts/vias, interconnect metal layers, dielectric layers, passivation layers, etc.

Figure 29A:
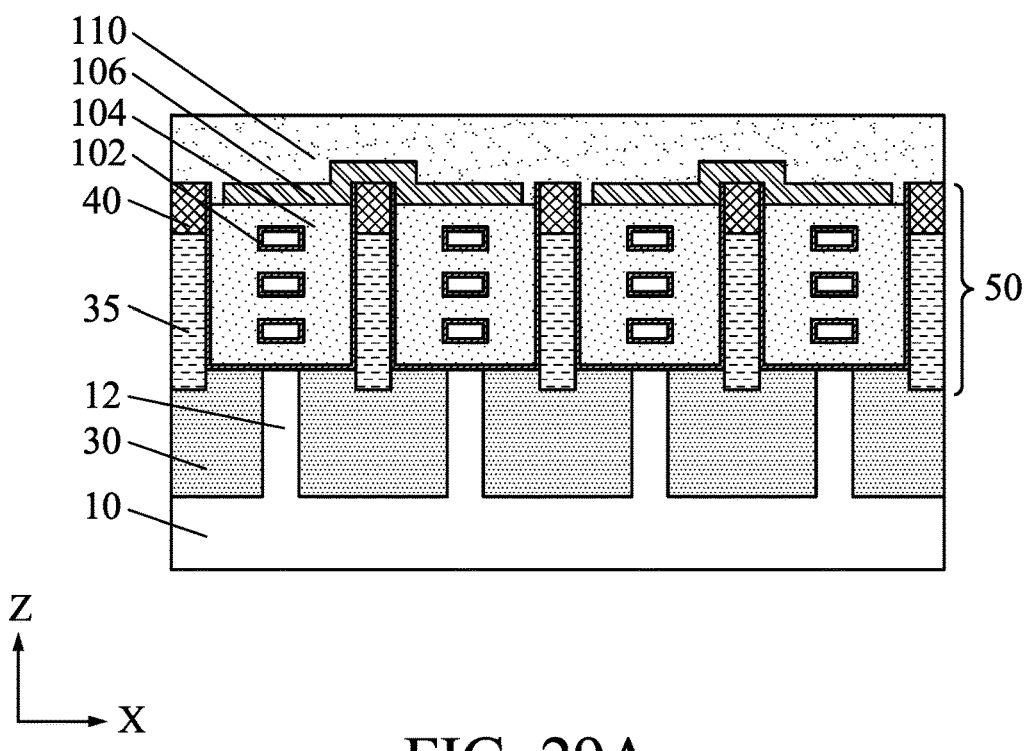
FIGS. 29A, 29B, 30A and 30B show various views of semiconductor FET devices according to embodiments of the present disclosure.

In some embodiments, when the recessing the conductive layers 104 and the third dielectric layer 40 shown in FIG. 20 results in an uneven recessed surface, for example, the conductive layers 104 are recessed more than the third dielectric layer 40, the body gate electrode layer 106 is formed over the uneven surface as shown in FIG. 29A.

Figure 29B:
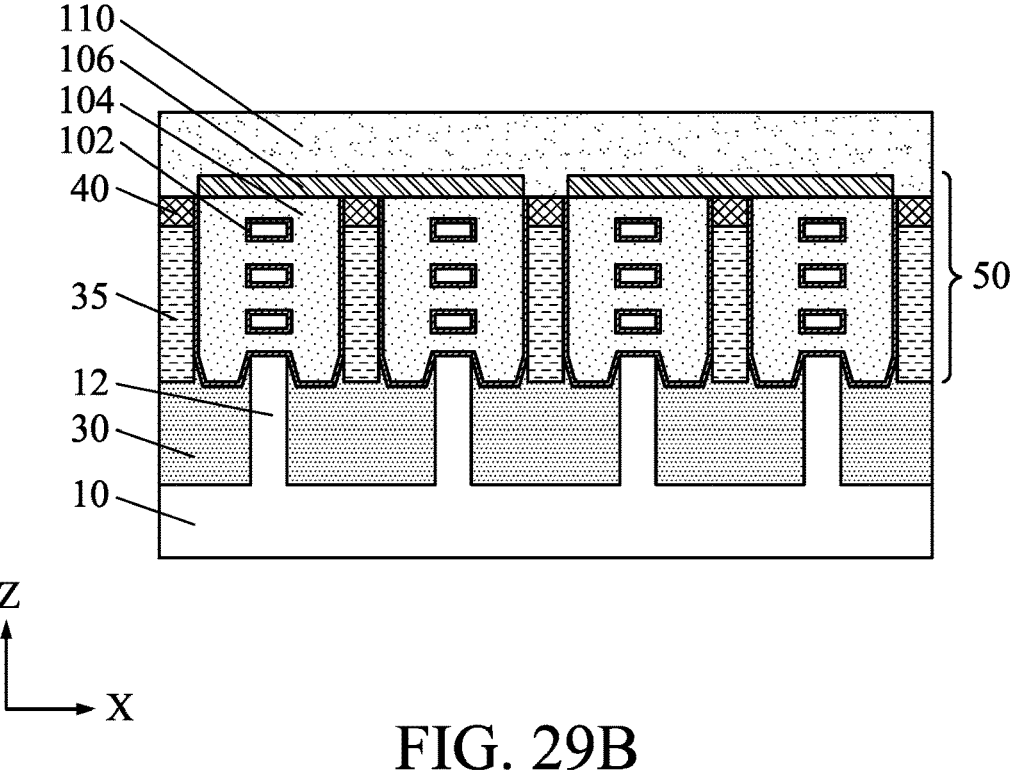

In some embodiments, when, in the recessing the first dielectric layer 30 as shown in FIG. 9, the first dielectric layer 30 is recessed below the top of the bottom fin structure 12, the gate dielectric layer 102 and the conductive layers 104 are formed below the top of the bottom fin structure 12, as shown in FIG. 29B.

Figure 30A:
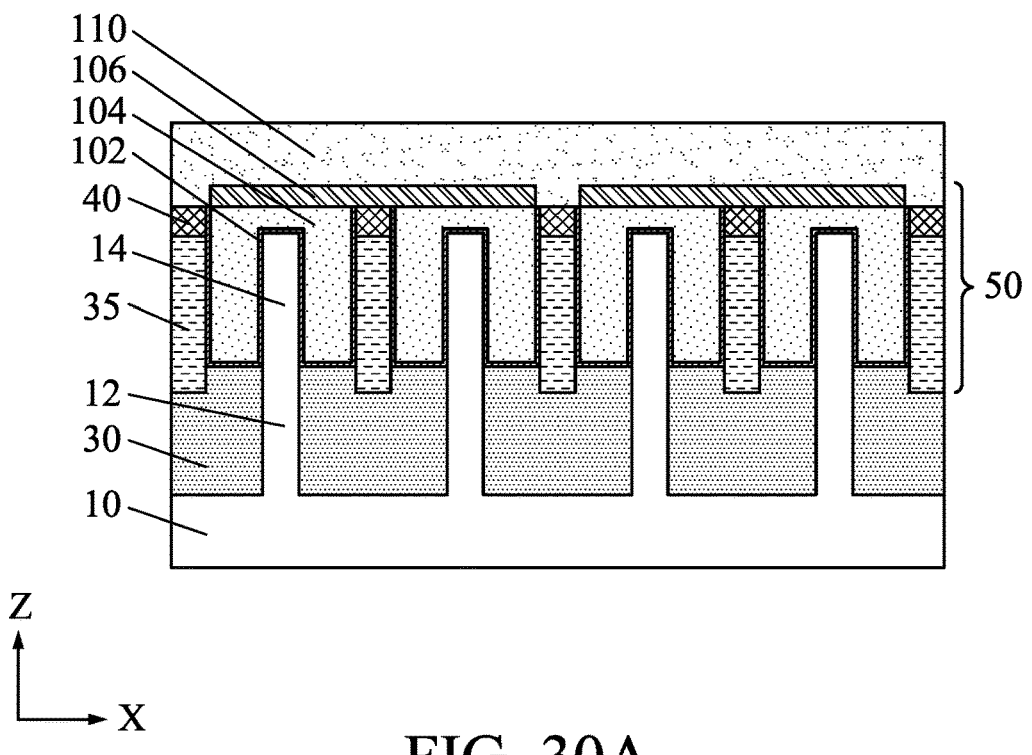
Figure 30B:
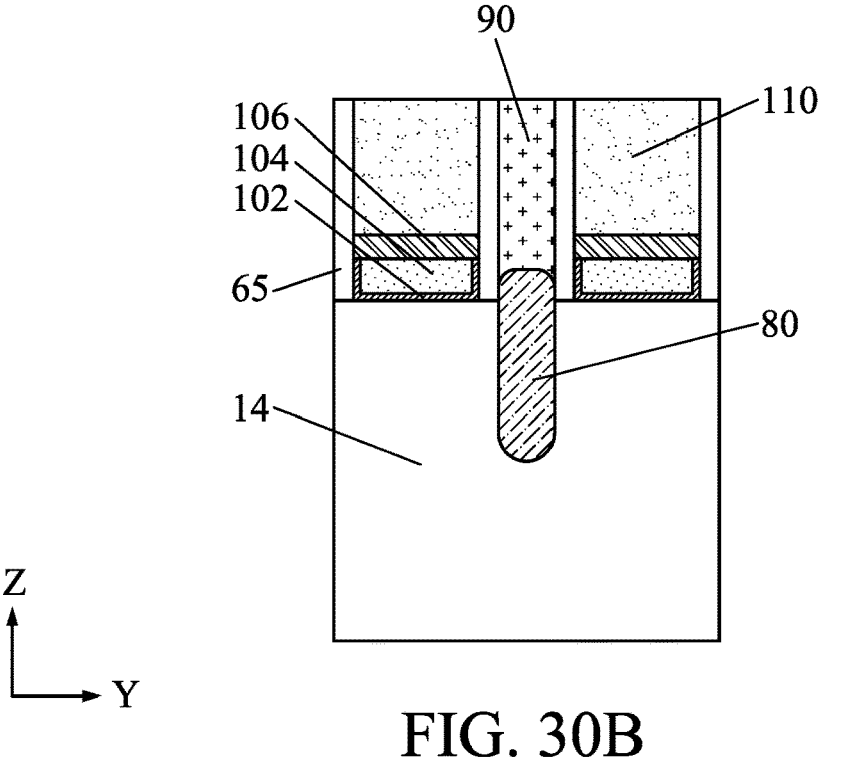

In some embodiments, the FET is a FinFET as shown in FIGS. 30A and 30B having a channel region 14 continuously disposed over the bottom fin structure 12 (no interface between regions 12 and 14). Materials, configurations, dimensions, processes and/or operations as described with respect to the GAA FET device above are applied to the FinFET device except for forming nanosheet or nanowire channel regions.

In the embodiments of the present disclosure where one or more conductive layers (e.g., the body gate electrode layer) are formed by PVD in a non-conformal manner and then selectively removed, it is possible to improve process flexibility and suppress formation of voids or seams in the conductive layer. In addition, it is possible to form fluorine and/or chlorine free W layers by using PVD, and thus, suppress damage to the gate electrode. Moreover, since PVD is generally more economical than CVD and/or ALD, it is possible to reduce the manufacturing cost and improve throughput.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a lower conductive layer is formed in an opening formed in a dielectric layer, the lower conductive layer is recessed to form a space, a blanket conductive layer is formed over the recessed lower conductive layer in the space, on a sidewall of the space and an upper surface of the dielectric layer, part of the blanket conductive layer formed on the sidewall of the space and the upper surface of the dielectric layer is removed, thereby forming a upper conductive layer on the lower conductive layer, and a cap insulating layer is formed over the upper conductive layer in the space. The blanket conductive layer is formed by physical vapor deposition. In one or more of the foregoing or the following embodiments, the part of the blanket conductive layer formed on the sidewall of the opening and the upper surface of the dielectric layer is removed by the followings. A first part of the blanket conductive layer formed on the sidewall of the space is removed, a protection layer is formed in the space and over a second part of the blanket conductive layer formed on the upper surface of the dielectric layer, the protection layer is receded such that the second part of the blanket conductive layer is exposed while a third part of the blanket conductive layer formed on the lower conductive layer is covered by the protective layer, the second part of the blanket conductive layer is removed, and the protection layer covering the third part of the blanket conductive layer is removed. In one or more of the foregoing or the following embodiments, the first part is removed by using a directional etching process. In one or more of the foregoing or the following embodiments, the first part is removed by a wet etching process. In one or more of the foregoing or the following embodiments, the upper conductive layer is free from fluorine and chlorine. In one or more of the foregoing or the following embodiments, the upper conductive layer is made of W.

In accordance with another aspect of the present disclosure, in a method of manufacturing a semiconductor device, semiconductor fins are formed over a substrate, a wall fin is formed between adjacent two of the semiconductor fins, the wall fin including dielectric layers, an isolation insulating layer is formed such that an upper portion of each of the semiconductor fins and an upper portion of the wall fin protrude from the isolation insulating layer, a sacrificial gate structure is formed over the upper portion of the semiconductor fins and the upper portion of the wall fin, gate sidewall spacers are formed on a sidewall of the sacrificial gate structure, an interlayer dielectric (ILD) layer is formed, the sacrificial gate structure is removed, thereby forming a gate space, a gate dielectric layer is formed in the gate space, one or more conductive layers are formed over the gate dielectric layer, the one or more conductive layers are recessed such that a part of the wall fin is exposed, a blanket conductive layer is formed over the one or more conductive layers and the wall fin, on the gate sidewall spacer and an upper surface of the ILD layer, part of the blanket conductive layer formed on the gate sidewall spacer and the upper surface of the ILD layer is removed, thereby forming a metal gate electrode layer on the one or more conductive layers and the wall fin, and the metal gate electrode layer is patterned into multiple gate electrodes. In one or more of the foregoing or the following embodiments, the part of the blanket conductive layer formed on the gate sidewall spacers and the upper surface of the ILD layer is removed by the following. A first part of the blanket conductive layer formed on the sidewall of the space is removed, a protection layer is formed over the one or more conductive layers and over a second part of the blanket conductive layer formed on the upper surface of the ILD layer, the protection layer is recessed such that the second part of the blanket conductive layer is exposed while a third part of the blanket conductive layer formed on the one or more conductive layers is covered by the protective layer, the second part of the blanket conductive layer is removed, and the protection layer covering the third part of the blanket conductive layer is removed. In one or more of the foregoing or the following embodiments, after the multiple gate electrodes are formed, a cap insulating layer is formed over the multiple gate electrodes. In one or more of the foregoing or the following embodiments, the blanket conductive layer is formed by physical vapor deposition. In one or more of the foregoing or the following embodiments, the wall fin is formed by the following. A first dielectric layer is formed over the semiconductor fins, a second dielectric layer is formed over the first dielectric layer, the second dielectric layer is recessed below a top of each of the semiconductor fins, a third dielectric layer is formed over the recessed second dielectric layer, and the third dielectric layer is recessed below the top of each of the semiconductor fins. In one or more of the foregoing or the following embodiments, the wall fin comprises the recessed third dielectric layer and the recessed second dielectric layer disposed under the recessed third dielectric layer. In one or more of the foregoing or the following embodiments, after the wall fin is formed, the first dielectric layer is recessed below a top of the wall fin, thereby forming the isolation insulating layer. In one or more of the foregoing or the following embodiments, the first dielectric layer, the second dielectric layer and the third dielectric layer comprise different dielectric materials from each other. In one or more of the foregoing or the following embodiments, the third dielectric layer includes one or more hafnium oxide layers. In one or more of the foregoing or the following embodiments, the second dielectric layer includes silicon oxide, and the first dielectric layer includes silicon nitride.

In accordance with another aspect of the present disclosure, in a method of manufacturing a semiconductor device, semiconductor fins are formed over a substrate. Each of the semiconductor fins includes first semiconductor layer and second semiconductor layer alternately stacked over a bottom fin structure protruding from the substrate. A wall fin is formed between adjacent two of the semiconductor fins, the wall fin including dielectric layers. An isolation insulating layer is formed such that an upper portion of each of the semiconductor fins and an upper portion of the wall fin protrude from the isolation insulating layer. A sacrificial gate structure is formed over the upper portion of the semiconductor fins and the upper portion of the wall fin. Gate sidewall spacers are formed on a sidewall of the sacrificial gate structure. An interlayer dielectric (ILD) layer is formed. The sacrificial gate structure is removed, thereby forming a gate space. The first semiconductor layers are removed in the gate space. A gate dielectric layer is formed to wrap around each of the second semiconductor layers in the gate space. One or more conductive layers are formed over the gate dielectric layer. The one or more conductive layers are recessed such that a part of the wall fin is exposed. A blanket conductive layer is formed over the one or more conductive layers and the wall fin, on the gate sidewall spacer and an upper surface of the ILD layer. Part of the blanket conductive layer formed on the gate sidewall spacer and the upper surface of the ILD is removed, thereby forming a metal gate electrode layer on the one or more conductive layers and the wall fin. The metal gate electrode layer is patterned into multiple gate electrodes. In one or more of the foregoing or the following embodiments, the one or more conductive layers are formed to a same level as a top of the ILD layer, and are then recessed. In one or more of the foregoing or the following embodiments, a space between adjacent two of the multiple gate electrodes is disposed over the wall fin. In one or more of the foregoing or the following embodiments, the wall fin includes a first dielectric layer, a second dielectric layer disposed on the first dielectric layer, a third dielectric layer disposed on the first and second dielectric layers, and the third dielectric layer includes a silicon oxide layer disposed between two hafnium oxide layers. In one or more of the foregoing or the following embodiments, the blanket conductive layer is made of W free from chlorine and fluorine.

In accordance with another aspect of the present disclosure, in a method of manufacturing a semiconductor device, a fin structure protruding from an isolation insulating layer disposed over a substrate is formed, a sacrificial gate dielectric layer is formed over the fin structure, a sacrificial gate electrode layer is formed over the sacrificial gate dielectric layer, gate sidewall spacers are formed, one or more dielectric layers are formed over the sidewall spacers, a gate space is formed by removing the sacrificial gate electrode layer and the sacrificial gate dielectric layer, after the gate space is formed, the gate sidewall spacers are recessed, a gate dielectric layer is formed in the gate space, conductive layers are formed on the gate dielectric layer to fully fill the gate space, the gate dielectric layer and the conductive layers are recessed to form recessed conductive layers, an upper conductive layer is formed on the recessed conductive layers in the gate space, the upper conductive layer is patterned in the gate space, thereby forming multiple gate electrode layers, and a cap insulating layer is formed over the multiple gate electrode layers. In one or more of the foregoing or the following embodiments, the one or more dielectric layer includes an etching stop layer conformally formed on side faces of the gate sidewall spacers and an interlayer dielectric (ILD) layer formed on the etching stop layer. In one or more of the foregoing or the following embodiments, the ILD layer includes a silicon oxide layer and a silicon nitride layer, both of which are in contact with the etching stop layer. In one or more of the foregoing or the following embodiments, the etching stop layer includes silicon nitride. In one or more of the foregoing or the following embodiments, the upper conductive layer is one of W, Ta, Sn, Nb or Mo free from chlorine and fluorine. In one or more of the foregoing or the following embodiments, the upper conductive layer is formed by the following. A blanket conductive layer is formed over the conductive layers, on the gate sidewall spacer and an upper surface of the one or more dielectric layers, and part of the blanket conductive layer formed on the gate sidewall spacer and the upper surface of the one or more dielectric layers is removed.

In accordance with another aspect of the present disclosure, a semiconductor device includes a first group of semiconductor layers vertically arranged over a first bottom fin structure and a second group of semiconductor layers vertically arranged over a second bottom fin structure, an isolation insulating layer disposed over a substrate, a wall fin comprising dielectric layers disposed between the first group of semiconductor layers and the second group of semiconductor layers, and a gate structure. The gate structure includes a first gate dielectric layer wrapping around each of the first group of semiconductor layers and a second gate dielectric layer wrapping around each of the second group of semiconductor layers, first conductive layers disposed over the first gate dielectric layer and second conductive layers disposed over the second gate dielectric layer, and a gate electrode disposed over the first conductive layers and the second conductive layers. In one or more of the foregoing or the following embodiments, the first conductive layers and the second conductive layers are separated by the wall fin. In one or more of the foregoing or the following embodiments, the gate electrode is disposed on the wall fin. In one or more of the foregoing or the following embodiments, the wall fin includes a first part and a second part, and a top of the second part is lower than a top of the first part. In one or more of the foregoing or the following embodiments, the gate electrode is disposed on the second part of the wall fin. In one or more of the foregoing or the following embodiments, the first part of the wall fin is covered by an interlayer dielectric layer. In one or more of the foregoing or the following embodiments, the semiconductor device further includes a first source/drain epitaxial layer contacting the first group of semiconductor layers, and a second source/drain epitaxial layer contacting the second group of semiconductor layers. The first source/drain epitaxial layer and the second source/drain epitaxial layer are separated by the wall fin. In one or more of the foregoing or the following embodiments, the wall fin includes a lower dielectric layer and an upper dielectric layer disposed over the lower dielectric layer and made of a different material than the lower dielectric layer, and the upper dielectric layer includes a dielectric material having a dielectric constant higher than the lower dielectric layer and the isolation insulating layer. In one or more of the foregoing or the following embodiments, the upper dielectric layer includes at least one selected from the group consisting of $HfO_2$, HfSiO, HfSiON, HfTaO, HfTiO, HfZrO, zirconium oxide, aluminum oxide, titanium oxide, and a hafnium dioxide-alumina ($HfO_2$—$Al_2O_3$) alloy. In one or more of the foregoing or the following embodiments, the lower dielectric layer includes at least one selected from the group consisting of silicon nitride, silicon oxynitride, SiOC and SiOCN. In one or more of the foregoing or the following embodiments, the gate electrode layer contacts the upper dielectric layer.

In accordance with another aspect of the present disclosure, a semiconductor device includes a first group of semiconductor layers vertically arranged over a first bottom fin structure, a second group of semiconductor layers vertically arranged over a second bottom fin structure and a third group of semiconductor layers vertically arranged over a third bottom fin structure, an isolation insulating layer disposed over a substrate, a first wall fin comprising dielectric layers disposed between the first group of semiconductor layers and the second group of semiconductor layers, a second wall fin comprising the dielectric layers disposed between the second group of semiconductor layers and the third group of semiconductor layers, and a first gate structure and a second gate structure. The first gate structure includes a first gate dielectric layer wrapping around each of the first group of semiconductor layers and a second gate dielectric layer wrapping around each of the second group of semiconductor layers, first conductive layers disposed over the first gate dielectric layer and second conductive layers disposed over the second gate dielectric layer, and a first gate electrode disposed over the first conductive layers and the second conductive layers. The second gate structure includes a third gate dielectric layer wrapping around each of the third group of semiconductor layers, third conductive layers disposed over the third gate dielectric layer, and a second gate electrode disposed over the third conductive layers. The second gate electrode is spaced apart from the first gate electrode. In one or more of the foregoing or the following embodiments, the semiconductor device further includes a gate cap insulating layer continuously disposed over the first gate electrode and the second gate electrode. In one or more of the foregoing or the following embodiments, the gate cap insulating layer contacts a top of the second wall fin. In one or more of the foregoing or the following embodiments, the semiconductor device further includes a first source/drain epitaxial layer contacting the first group of semiconductor layers, a second source/drain epitaxial layer contacting the second group of semiconductor layers, and a third source/drain epitaxial layer contacting the third group of semiconductor layers. The first source/drain epitaxial layer and the second source/drain epitaxial layer are separated by the first wall fin, and the second source/drain epitaxial layer and the third source/drain epitaxial layer are separated by the second wall fin. In one or more of the foregoing or the following embodiments, each of the first and second wall fins includes a first dielectric layer, a second dielectric layer disposed on the first dielectric layer, a third dielectric layer disposed on the first and second dielectric layers, and the third dielectric layer includes a silicon oxide layer disposed between two hafnium oxide layers.

In accordance with another aspect of the present disclosure, a semiconductor device includes a first fin structure and a second fin structure, an isolation insulating layer disposed over a substrate, a wall fin comprising dielectric layers disposed between the first fin structure and the second fin structure, and a gate structure. The gate structure includes a first gate dielectric layer disposed over an upper portion of the first fin structure and a second gate dielectric layer disposed an upper portion of the second fin structure, first conductive layers disposed over the first gate dielectric layer and second conductive layers disposed over the second gate dielectric layer, and a gate electrode disposed over the first conductive layers and the second conductive layers. In one or more of the foregoing or the following embodiments, the first conductive layers and the second conductive layers are separated by the wall fin. In one or more of the foregoing or the following embodiments, the wall fin includes a first dielectric layer, a second dielectric layer disposed on the first dielectric layer, a third dielectric layer disposed on the first and second dielectric layers, and a bottom of the third dielectric layer has a V-shape cross section. In one or more of the foregoing or the following embodiments, the gate electrode contacts the third dielectric layer and separated from the second and first dielectric layer by the third dielectric layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a lower conductive layer in an opening formed in a dielectric layer;

recessing the lower conductive layer to form a space;

forming a blanket conductive layer over the recessed lower conductive layer in the space, on a sidewall of the space and an upper surface of the dielectric layer;

removing parts of the blanket conductive layer formed on the sidewall of the space and the upper surface of the dielectric layer, thereby forming an upper conductive layer on the recessed lower conductive layer, wherein the parts of the blanket conductive layer formed on the sidewall of the space and the upper surface of the dielectric layer are removed by:

removing a first part of the blanket conductive layer formed on the sidewall of the space;

forming a filling material layer in the space and over a second part of the blanket conductive layer formed on the upper surface of the dielectric layer;

recessing the filling material layer such that the second part of the blanket conductive layer is exposed while a third part of the blanket conductive layer formed on the recessed lower conductive layer is covered by a remainder of the filling material layer;

removing the second part of the blanket conductive layer; and removing the remainder of the filling material layer covering the third part of the blanket conductive layer; and forming a cap insulating layer over the upper conductive layer in the space, wherein the blanket conductive layer is formed by a physical vapor deposition.

2. The method of claim 1, wherein the first part of the blanket conductive layer is removed by using a directional etching process.

3. The method of claim 1, wherein the first part of the blanket conductive layer is removed by a wet etching process.

4. The method of claim 1, wherein the upper conductive layer is free from fluorine and chlorine.

5. The method of claim 1, wherein the upper conductive layer is made of W.

6. A method of manufacturing a semiconductor device, the method comprising:

forming fin structures over a substrate;

forming a wall fin between adjacent two of the fin structures, the wall fin including dielectric layers;

forming an isolation insulating layer such that an upper portion of each of the fin structures and an upper portion of the wall fin protrude from the isolation insulating layer;

forming a sacrificial gate structure over the upper portions of each of the fin structures and the upper portion of the wall fin;

forming gate sidewall spacers on a sidewall of the sacrificial gate structure;

forming an interlayer dielectric (ILD) layer over the fin structures and the wall fin;

removing the sacrificial gate structure, thereby forming a gate space;

forming a gate dielectric layer in the gate space;

forming one or more conductive layers over the gate dielectric layer;

recessing the one or more conductive layers such that a part of the wall fin is exposed;

forming a blanket conductive layer over the one or more recessed conductive layers, the wall fin, the gate sidewall spacers and an upper surface of the ILD layer;

removing parts of the blanket conductive layer formed over the gate sidewall spacers and the upper surface of the ILD layer, thereby forming a metal gate electrode layer on the recessed one or more conductive layers and the wall fin, wherein the parts of the blanket conductive layer formed on the gate sidewall spacers and the upper surface of the ILD layer are removed by:

removing a first part of the blanket conductive layer formed on the gate sidewall spacers;

forming a filling material layer over the one or more conductive layers and over a second part of the blanket conductive layer formed on the upper surface of the ILD layer;

recessing the filling material layer such that the second part of the blanket conductive layer is exposed while a third part of the blanket conductive layer formed on the recessed one or more conductive layers is covered by a remainder of the filling material layer;

removing the second part of the blanket conductive layer; and removing the remainder of the filling material layer covering the third part of the blanket conductive layer; and patterning the metal gate electrode layer into multiple gate electrodes.

7. The method of claim 6, further comprising:

after the multiple gate electrodes are formed, forming a cap insulating layer over the multiple gate electrodes.

8. The method of claim 6, wherein the blanket conductive layer is formed by a physical vapor deposition.

9. The method of claim 6, wherein the wall fin is formed by:

forming a first dielectric layer over the fin structures;

forming a second dielectric layer over the first dielectric layer;

recessing the second dielectric layer below a top of each of the fin structures;

forming a third dielectric layer over the recessed second dielectric layer; and planarizing the third dielectric layer to or below the top of each of the fin structures, wherein the wall fin comprises the planarized third dielectric layer and the recessed second dielectric layer disposed under the planarized third dielectric layer.

10. The method of claim 9, further comprising:

after the wall fin is formed, recessing the first dielectric layer below a top of the wall fin, thereby forming the isolation insulating layer.

11. The method of claim 10, wherein the first dielectric layer, the second dielectric layer and the third dielectric layer comprise different dielectric materials from each other.

12. The method of claim 11, wherein the third dielectric layer includes one or more hafnium oxide layers.

13. The method of claim 12, wherein the second dielectric layer includes silicon oxide, and the first dielectric layer includes silicon nitride.

14. A method of manufacturing a semiconductor device, comprising:

forming a fin structure protruding from an isolation insulating layer;

forming a sacrificial gate dielectric layer over the fin structure;

forming a sacrificial gate electrode layer over the sacrificial gate dielectric layer;

forming gate sidewall spacers;

forming one or more dielectric layers over the gate sidewall spacers;

forming a gate space by removing the sacrificial gate electrode layer and the sacrificial gate dielectric layer;

recessing the gate sidewall spacers;

forming a gate dielectric layer in the gate space;

forming conductive layers on the gate dielectric layer to fill the gate space;

recessing the gate dielectric layer;

recessing the conductive layers to form recessed conductive layers;

forming an upper conductive layer on the recessed conductive layers in the gate space;

patterning the upper conductive layer in the gate space, thereby forming multiple gate electrode layers; and forming a cap insulating layer over the multiple gate electrode layers, wherein the cap insulating layer is formed on upper surfaces and side surfaces of each of the multiple gate electrode layers without an intervening layer, when viewed in a cross-section.

15. The method according to claim 14, wherein the one or more dielectric layers include an etching stop layer conformally formed on side faces of the gate sidewall spacers, and an interlayer dielectric (ILD) layer formed on the etching stop layer.

16. The method according to claim 15, wherein the ILD layer includes a silicon oxide layer and a silicon nitride layer, wherein the silicon oxide layer and the silicon nitride layer are in contact with the etching stop layer.

17. The method according to claim 16, wherein the etching stop layer includes silicon nitride.

18. The method according to claim 14, wherein the upper conductive layer is one of W, Ta, Sn, Nb, or Mo free from chlorine and fluorine.

19. The method according to claim 14, wherein the cap insulating layer comprises one or more layers of dielectric material.

20. The method according to claim 14, wherein the cap insulating layer is selected from the group consisting of silicon oxide, silicon nitride, SiON, SiOC, and SiOCN.

\* \* \* \* \*